United States Patent
Landon et al.

(10) Patent No.: US 10,404,284 B1
(45) Date of Patent: Sep. 3, 2019

(54) PARALLEL-TO-PARALLEL CONVERSION AND REORDERING OF A BLOCK OF DATA ELEMENTS

(71) Applicant: L-3 Communications Corp., New York, NY (US)

(72) Inventors: David G. Landon, Bountiful, UT (US); Ryan W. Hinton, Erda, UT (US); Kelly D. Griffiths, Bountiful, UT (US); Ayyoob D. Abbaszadeh, Salt Lake City, UT (US)

(73) Assignee: L-3 COMMUNICATIONS CORP., New York, NY (US)

( * ) Notice: Subject to any disclaimer, the term of this patent is extended or adjusted under 35 U.S.C. 154(b) by 559 days.

(21) Appl. No.: 14/805,155

(22) Filed: Jul. 21, 2015

(51) Int. Cl.
*H03M 13/23* (2006.01)
*H03M 13/09* (2006.01)
*G06F 11/10* (2006.01)

(52) U.S. Cl.
CPC ....... *H03M 13/235* (2013.01); *G06F 11/1096* (2013.01); *H03M 13/098* (2013.01)

(58) Field of Classification Search
CPC .............. H03M 13/235; H03M 13/098; G06F 11/1096
See application file for complete search history.

(56) References Cited

U.S. PATENT DOCUMENTS

| | | | |
|---|---|---|---|
| 5,809,043 A | 9/1998 | Hassan et al. | |
| 6,539,367 B1 | 3/2003 | Blanksby et al. | |
| 7,313,752 B2 | 12/2007 | Kyung et al. | |
| 8,266,493 B1 | 9/2012 | Abbaszadeh et al. | |
| 8,719,683 B2 | 5/2014 | Kyung et al. | |
| 9,104,589 B1 | 8/2015 | Landon et al. | |
| 2002/0083390 A1* | 6/2002 | Lee | G06F 11/1072 714/763 |
| 2002/0188906 A1 | 12/2002 | Kurtas et al. | |

(Continued)

FOREIGN PATENT DOCUMENTS

WO 03/058904 A1 7/2003

OTHER PUBLICATIONS

Timmerman et al., "Ground Based High Data Rate DVB-S2 Demodulator for High Data Rate AISR Transport," IEEE (2010), pp. 1558-1563.
Constellation Mapper and Demapper for WiMAX, Application Note 439, version 1.1, Altera Corp. (May 2007), pp. 1-14.

(Continued)

*Primary Examiner* — Thien Nguyen
(74) *Attorney, Agent, or Firm* — Kirton McConkie; Brian Tucker

(57) ABSTRACT

A permutation apparatus can receive a data block of ordered data elements in parallel data segments that are $P_{in}$ number of data elements wide. The permutation apparatus can perform a parallel-to-parallel conversion and one or more reorder operations on the data elements and output the data block in parallel data segments that are $P_{out}$ number of data elements wide and in which at least some of the data elements are reordered. The $P_{in}$-parallel-data segments can be clocked into the permutation apparatus on successive cycles of a clock, and the $P_{out}$-parallel-data segments can be clocked out of the permutation apparatus on cycles of the same clock.

24 Claims, 16 Drawing Sheets

(56) References Cited

U.S. PATENT DOCUMENTS

| | | | | |
|---|---|---|---|---|
| 2008/0082762 | A1* | 4/2008 | Taeuber | G06F 13/4239 |
| | | | | 711/154 |
| 2010/0118800 | A1* | 5/2010 | Kim | H04L 1/0071 |
| | | | | 370/329 |
| 2011/0167315 | A1 | 7/2011 | Kyung et al. | |
| 2011/0289385 | A1* | 11/2011 | Takeuchi | G06F 11/1068 |
| | | | | 714/764 |
| 2013/0198592 | A1* | 8/2013 | Wang | H03M 13/2775 |
| | | | | 714/786 |
| 2014/0192855 | A1* | 7/2014 | Yomo | G06F 17/142 |
| | | | | 375/232 |
| 2014/0192856 | A1* | 7/2014 | Yomo | G06F 17/142 |
| | | | | 375/233 |
| 2014/0344639 | A1 | 11/2014 | Kyung et al. | |
| 2015/0039973 | A1* | 2/2015 | Jeong | H03M 13/11 |
| | | | | 714/776 |
| 2016/0345028 | A1* | 11/2016 | Kim | H03M 13/255 |

OTHER PUBLICATIONS

"Digital Video Broadcasting (DVD); Second generation framing structure, channel coding and modulation systems for Broadcasting, Interactive Services, News Gathering and other broadband satellite applications (DVD-S2)," ETSI EN 302 307 V1.2.1 (Aug. 2009), 78 pages (2009).

Falcao et al., "HDL Library of Processing Units for an Automatic LDPC Decoder Design," IEEE (2006), pp. 349-352.

Rovini et al., "On the Addition of an Input Buffer to an Interactive Decoder for LDPC Codes," IEEE (2007), pp. 1995-1999.

Gomes et al., "HDL Library of Processing Units for Generic and DVD-S2 LDPC Decoding," International Conference on Signal Processing and Multimedia Applications (SIGMAP2006), 2006 (8 pages).

Gomes et al., "Flexible Parallel Architecture for DVB-S2 LDPC Decoders," IEEE (2007), pp. 3265-3269.

U.S. Appl. No. 14/957,375, filed Dec. 2, 2015 (not yet published), which is owned by the same assignee as the instant application.

* cited by examiner

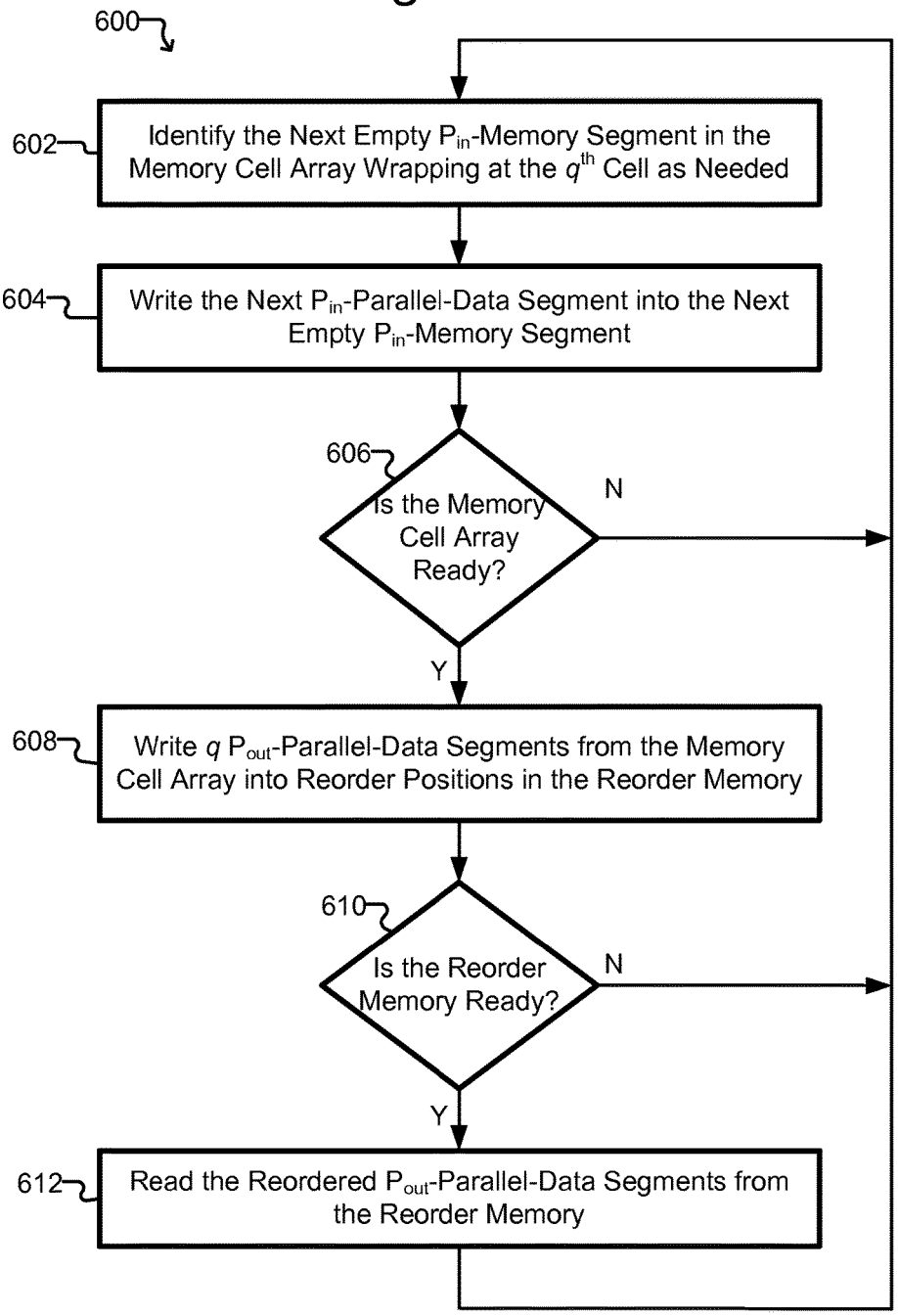

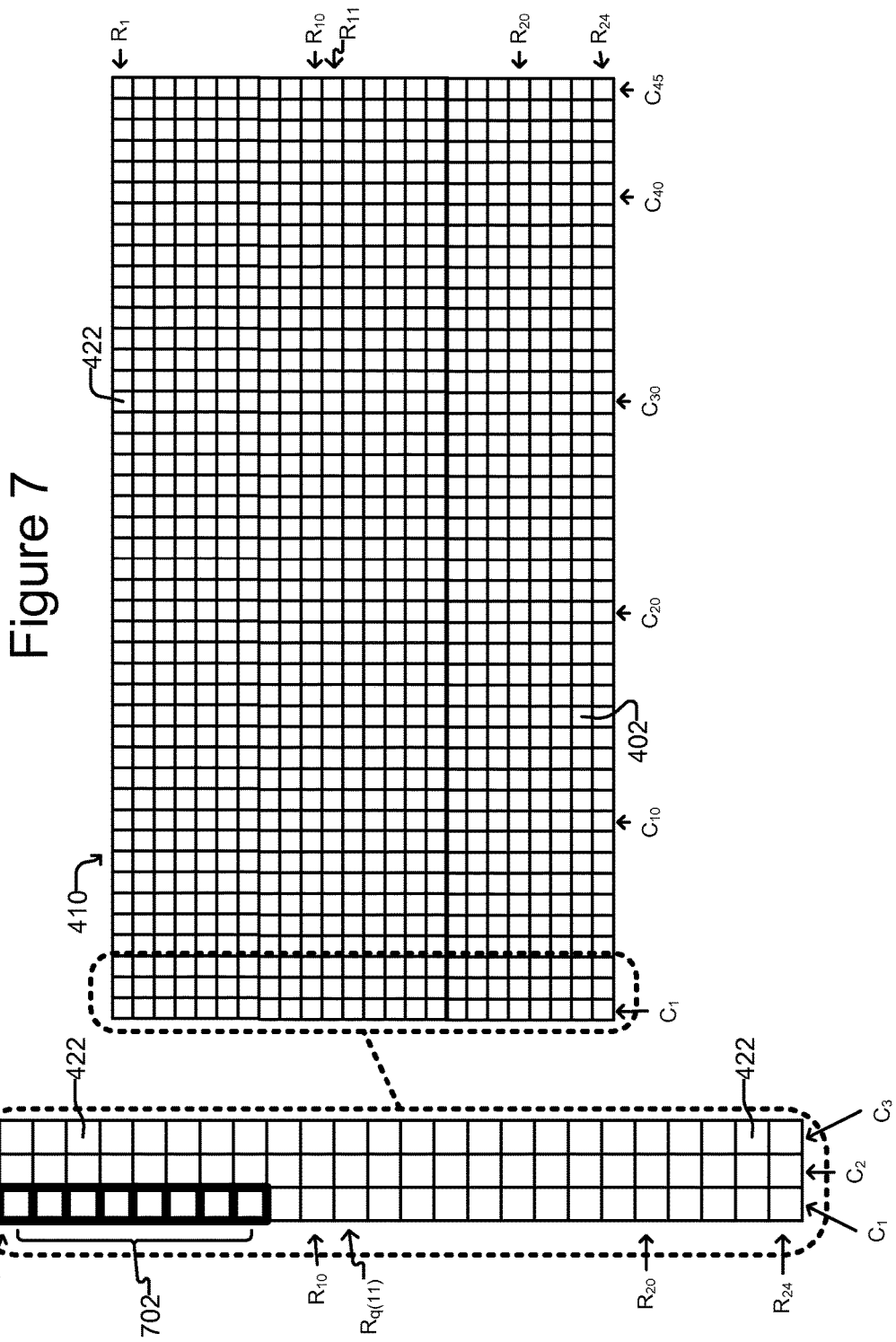

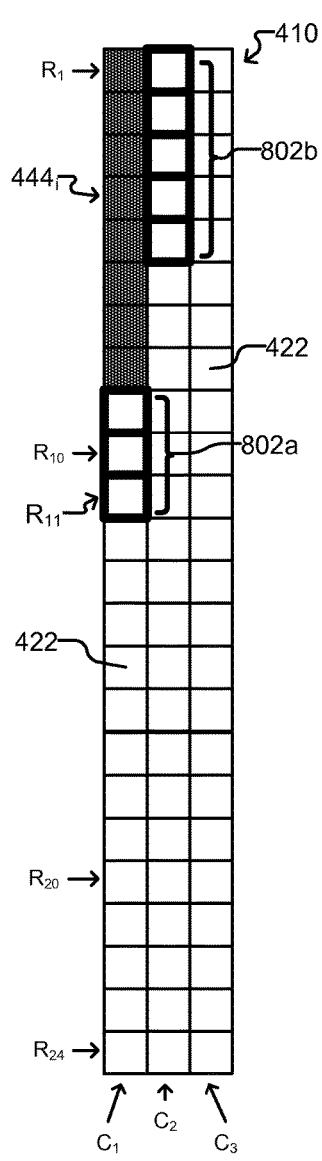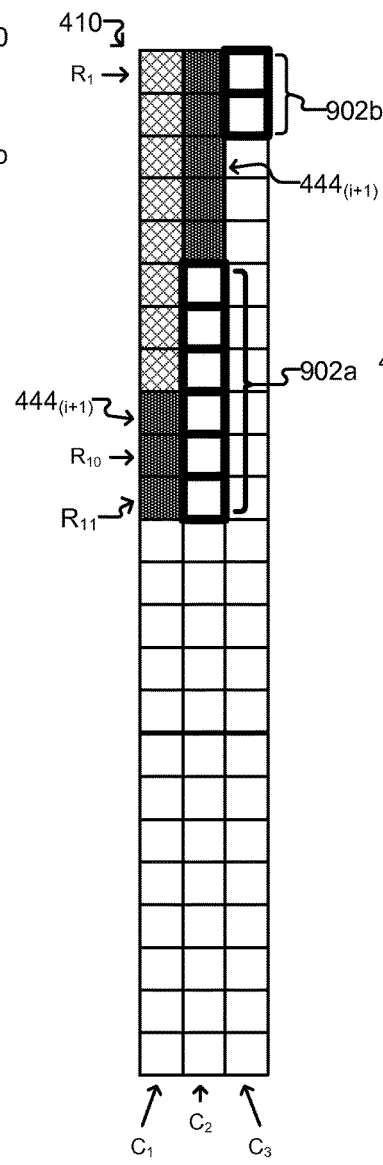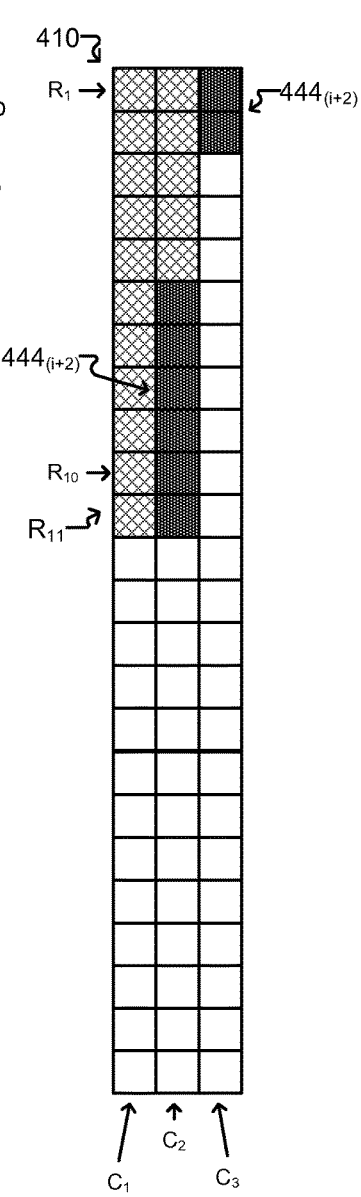

PARALLEL-TO-PARALLEL CONVERSION AND REORDERING OF A BLOCK OF DATA ELEMENTS

BACKGROUND

Permuting data elements of a data block can be a needed step in processing the data block. As one example, some or all of the data elements of an error-correction encoded data block received at a communications receiver may need to be permuted to be compatible with a decoder. For example, the received data block might be received in parallel data segments of a first width, but the decoder is configured to process the received data block in parallel data segments of a different width. In such a case, a parallel-to-parallel conversion may need to be performed. As another example, the order of the data elements in the received data block may need to be changed prior to the decoder processing the data block. Some embodiments of the invention include improved apparatuses and processes for rapidly and efficiently permuting data elements of a data block.

BRIEF DESCRIPTION OF THE DRAWINGS

FIG. 6 shows a process illustrating an example of operation of the conversion/reorder circuit of FIG. 4 according to some embodiments of the invention.

FIGS. 7-10 illustrate an example of writing $P_{in}$-parallel-data segments into the two-dimensional memory cell array of FIG. 4 to fill the memory cell array to the $q^{th}$ row according to some embodiments of the invention.

DETAILED DESCRIPTION OF EXEMPLARY EMBODIMENTS

Figure 1:
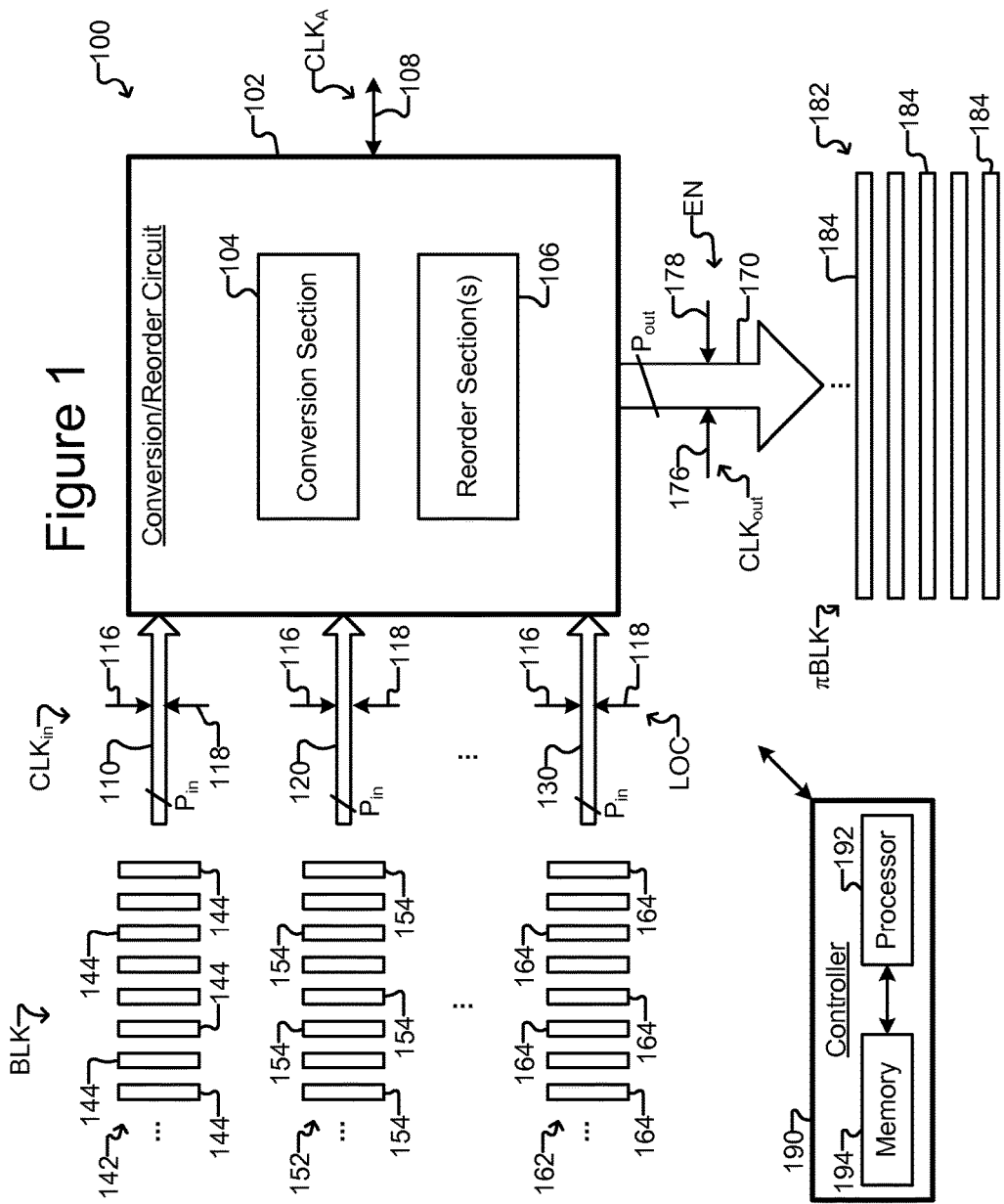
FIG. 1 illustrates an example of a data element permutation apparatus according to some embodiments of the invention.

This specification describes exemplary embodiments and applications of the invention. The invention, however, is not limited to these exemplary embodiments and applications or to the manner in which the exemplary embodiments and applications operate or are described herein. Moreover, the figures may show simplified or partial views, and the dimensions of elements in the figures may be exaggerated or otherwise not in proportion. In addition, as the terms "on," "attached to," or "coupled to" are used herein, one element (e.g., a material, a layer, a substrate, etc.) can be "on," "attached to," or "coupled to" another element regardless of whether the one element is directly on, attached to, or coupled to the other element or there are one or more intervening elements between the one element and the other element. Also, directions (e.g., above, below, top, bottom, side, up, down, under, over, upper, lower, horizontal, vertical, "x," "y," "z," etc.), if provided, are relative and provided solely by way of example and for ease of illustration and discussion and not by way of limitation. In addition, where reference is made to a list of elements (e.g., elements a, b, c), such reference is intended to include any one of the listed elements by itself, any combination of less than all of the listed elements, and/or a combination of all of the listed elements.

As used herein, "substantially" means sufficient to work for the intended purpose. The term "substantially" thus allows for minor, insignificant variations from an absolute or perfect state, dimension, measurement, result, or the like such as would be expected by a person of ordinary skill in the field but that do not appreciably affect overall performance. When used with respect to numerical values or parameters or characteristics that can be expressed as numerical values, "substantially" means within ten percent. The term "ones" means more than one.

As used herein in mathematical equations, "+" represents mathematical addition, "−" represents mathematical subtraction, "*" represents mathematical multiplication, and "/" represents mathematical division. In addition, "]Z[" denotes a ceiling function in which Z is rounded up to the next integer. Thus, for example, $]P_{out}/P_{in}[$ means the result of $P_{out}$ divided by $P_{in}$ rounded to the next highest integer. For example, ]37/6[=7; and ]45/8[=6. In addition, "[Z]" denotes a floor function in which Z is rounded down to the nearest integer. Thus, for example, [i/q] means the result of i divided by q rounded to the next lowest integer. For example, [37/6]=6; and [45/8]=5. As used herein in a mathematical expression, "mod(V/W)" denotes a modulo function that results in the remainder of V/W. For example, mod(37/6)=1; and mod(45/8)=5.

As used herein, "data element" means a unit of data. Examples of a data element include a binary bit, an m-ary symbol that represents multiple binary bits, or the like. Another example of a data element is an estimated value (e.g., a log likelihood ratio (LLR)) of a binary bit in an encoded block of binary bits received at a communications receiver. Such an estimated value can itself be represented by multiple binary bits.

As used herein, "$P_{in}$-parallel-data segment" means a set or group of $P_{in}$ number of data elements in parallel, where $P_{in}$ is an integer greater than or equal to one. Similarly, "$P_{out}$- parallel-data segment" means a set or group of $P_{out}$ number of data elements in parallel, where $P_{out}$ is an integer greater than or equal to one.

In some embodiments of the invention, a permutation apparatus can receive a block of ordered data elements (hereinafter a "data block") in $P_{in}$-parallel-data segments, perform a parallel-to-parallel conversion and one or more reorder operations on the data elements, and output the reordered data elements in $P_{out}$-parallel-data segments. Some embodiments of the invention can perform parallel-to-parallel conversion and one or more reorder operations on a block of data elements more rapidly and efficiently than has been possible.

FIG. 1 illustrates an example of a data element permutation apparatus 100. As shown, the permutation apparatus 100 can comprise one or more input modules 110, 120, 130 (three are shown but there can be fewer or more); a conversion/reorder circuit 102; an output module 170; and a controller 190. The permutation apparatus 100 can receive at the input modules 110, 120, 130 a data block BLK of ordered data elements in streams 142, 152, 162 of $P_{in}$-parallel-data segments 144, 154, 164; perform a parallel-to-parallel conversion and one or more reorderings of the data elements; and output at the output module 170 a permuted version of the data block πBLK comprising a stream 182 of $P_{out}$-parallel-data segments 184. The data elements can be in a first order in the received data block BLK but in a different order (e.g., a second or third order) in the permuted data block πBLK. Moreover, $P_{in}$ and $P_{out}$ can be unequal integers.

Figure 17:
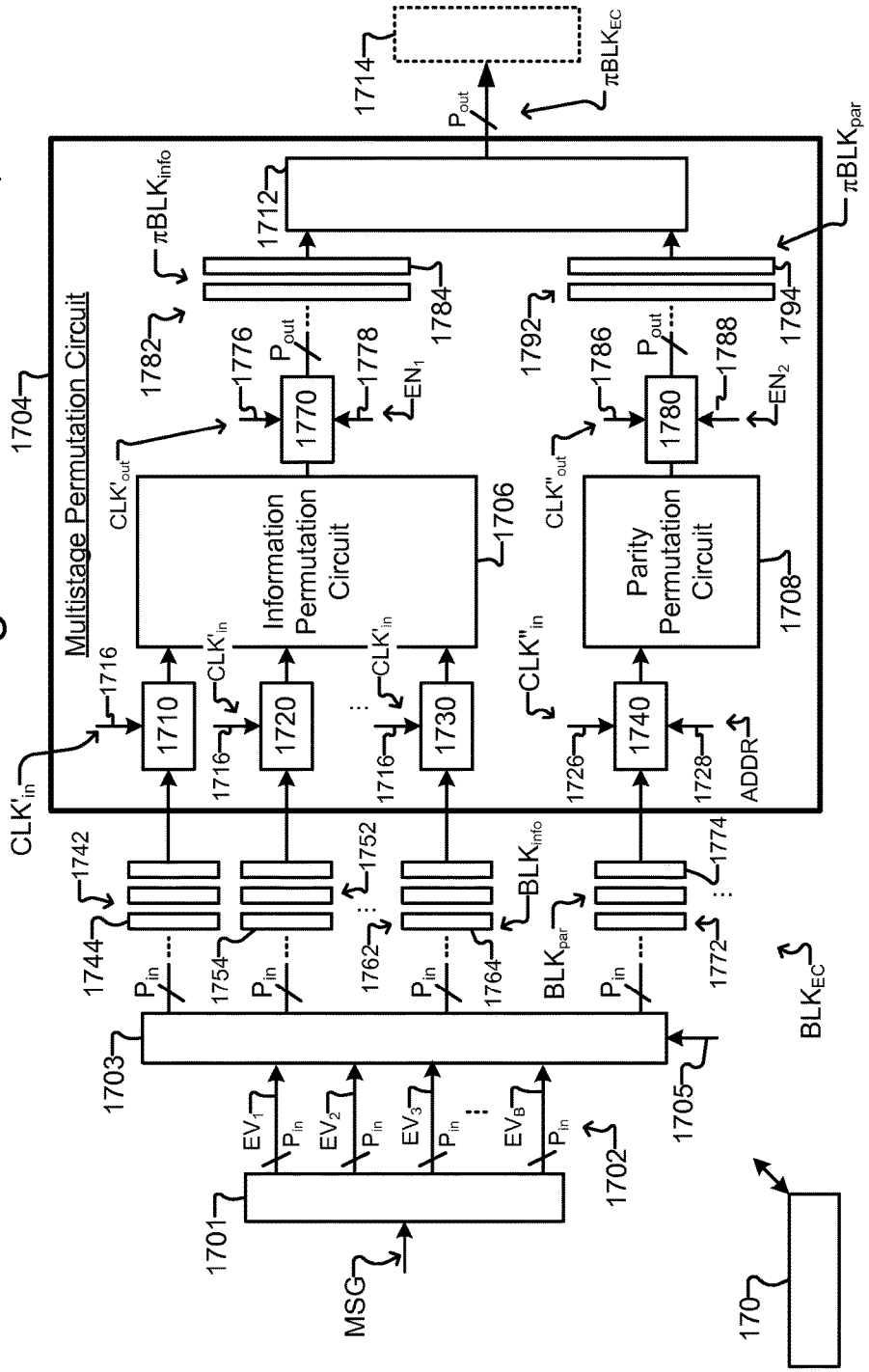
FIG. 17 illustrates an example of a pre-encoder circuit comprising permutation circuits for performing parallel-to-parallel conversions and data element reorders of the information portion and the parity portion of an error correction encoded data block according to some embodiments of the invention.
Figure 18:
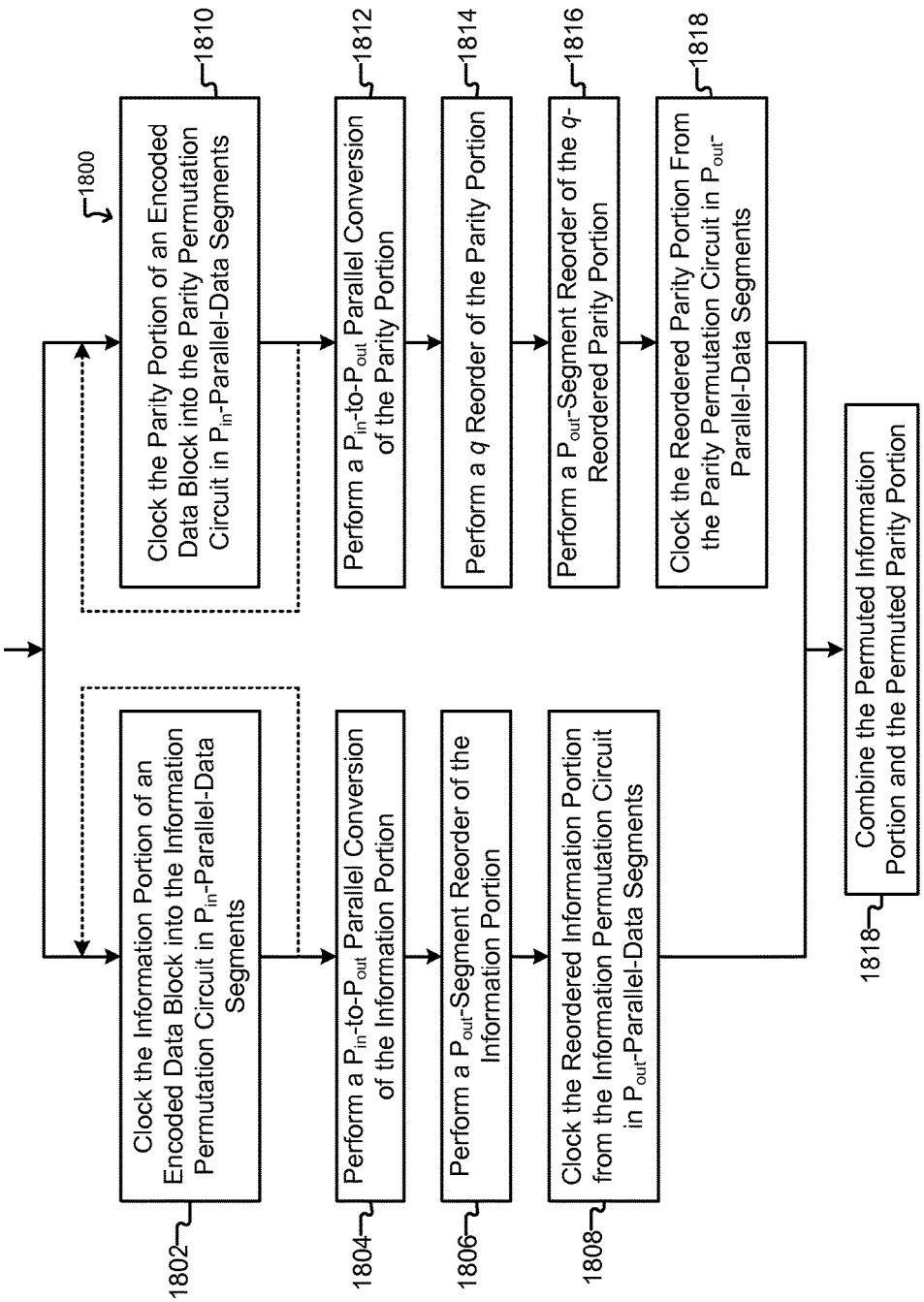
FIG. 18 is a process illustrating an example of operation of the pre-encoder circuit of FIG. 17 according to some embodiments of the invention.

The data block BLK can be any block of ordered data elements. For example, as illustrated in FIGS. 17 and 18 and discussed below, the received data block BLK can be the information portion or the parity portion of an error correction (e.g., a forward error correction (FEC)) encoded block of data elements in a message received at a communications receiver (e.g., a radio frequency (RF) receiver) (not shown) from a distant communications transmitter (e.g., an RF transmitter) (not shown).

Each input module 110, 120, 130 can be $P_{in}$ data elements wide and can comprise a clock port 116. On a cycle of a clock $CLK_{in}$ at the clock ports 116, each input module 110, 120, 130 can write a $P_{in}$-parallel-data segment 144, 154, 164 into a location in the conversion/reorder circuit 102. Locations can be specified by location LOC signals (e.g., address signals) on the locations ports 118 (e.g., address inputs) the input modules 110, 120, 130. Alternatively, one or more of the input modules 110, 120, 130 can be configured to write its parallel data segments 144, 154, 164 into the same location. Although the input modules 110, 120, 130 are illustrated in FIG. 1 as receiving the same clock $CLK_{in}$, one or more of the input modules 110, 120, 130 can alternatively receive a different clock signal.

The conversion/reorder circuit 102 can comprise a parallel-to-parallel conversion section 104 and one or more reorder sections 106. The parallel-to-parallel conversion section 104 can be configured to convert the $P_{in}$-parallel-data segments 144, 154, 164 into $P_{out}$-parallel-data segments. The reorder sections(s) 106 can perform one or more reorder operations on the data elements as received in the $P_{in}$-parallel-data segments. The circuit 102 can also include an input/output 108 for control signals, status signals, one or more clock signals $CLK_A$, or the like. Although one clock signal $CLK_A$ is shown in FIG. 1 among signals to and/or from the input/output 108, there can be more than one such clock signal. Moreover, the clock signal(s) $CLK_A$ can be the same clock signal as or a different clock signal than $CLK_{in}$. There can be one or more reorder sections 106. The parallel-to-parallel conversion section 104 and one or more of the reorder sections 106 can be distinct portions of the conversion reorder circuit 102 as illustrated. Alternatively, the parallel-to-parallel conversion section 104 and one or more of the reorder section(s) 106 can be part of the same portion of the conversion reorder circuit 102.

The output module 170 can be $P_{out}$ data elements wide and can comprise a clock port 176 and an enable port 178. The output module 170 can read $P_{out}$-parallel-data segments 184 from the conversion/reorder circuit 102 on successive cycles of a clock $CLK_{out}$. The output module 170 can thus produce a stream 182 of $P_{out}$-parallel-data segments 184, outputting each $P_{out}$-parallel-data segment on a cycle of the clock $CLK_{out}$. The clock $CLK_{out}$ can be the same clock signal or a different clock signal than one or both of the clocks $CLK_{in}$ and/or $CLK_A$.

The controller 190 can be configured to control operation of the permutation apparatus 100. For example, the controller 190 can be connected to the location ports 118, the enable port 178, and/or the input/output 108 and thus provide and/or receive control signals (e.g., location signals LOC and enable signals EN), status signals, and the like. The controller 190 can also provide one or more of the clock signals (e.g., $CLK_{in}$, $CLK_{out}$, and/or $CLK_A$) to the input modules 110, 120, 130, the conversion reorder circuit 102, and/or the output module 170.

As shown, the controller 190 can comprise a processor 192 and a digital memory 194. The processor 192 can be, for example, a digital processor, computer, an optical processor, or the like, and the digital memory 194 can be a digital memory for storing data and machine executable instructions (e.g., software, firmware, microcode, or the like) as non-transitory data or signals. The processor 192 can be configured to operate in accordance with such machine executable instructions stored in the memory 194. Alternatively or in addition, the processor 192 can comprise hard-wired digital circuitry and/or analog circuitry. The controller 190 can be configured to perform all or part of any process (e.g., process 300 of FIG. 3, process 600 of FIG. 6, and/or process 1800 of FIG. 18) or any step of a process, function, act, or the like discussed herein.

Regardless of how the processor 192 is configured (e.g., as a processor operating in accordance with machine executable instructions, as a hard wired device, or a combination of the foregoing), the processor 192 is a "circuit" as that term is used herein. Moreover, any element identified or described herein as a "circuit" can be configured in whole or in part as a processor (e.g., like 192) operating in accordance with machine executable instructions stored in a digital memory (e.g., like 194), a hard wired device, or a combination of the foregoing.

The controller 190 can be a stand-alone device as illustrated in FIG. 1. Alternatively, the controller 190 can be a distributed device. For example, all or part of the controller 190 can be part of the conversion/reorder circuit 102 and/or any element of the conversion reorder circuit 102 illustrated in any of the figures and/or discussed herein.

Figure 2:
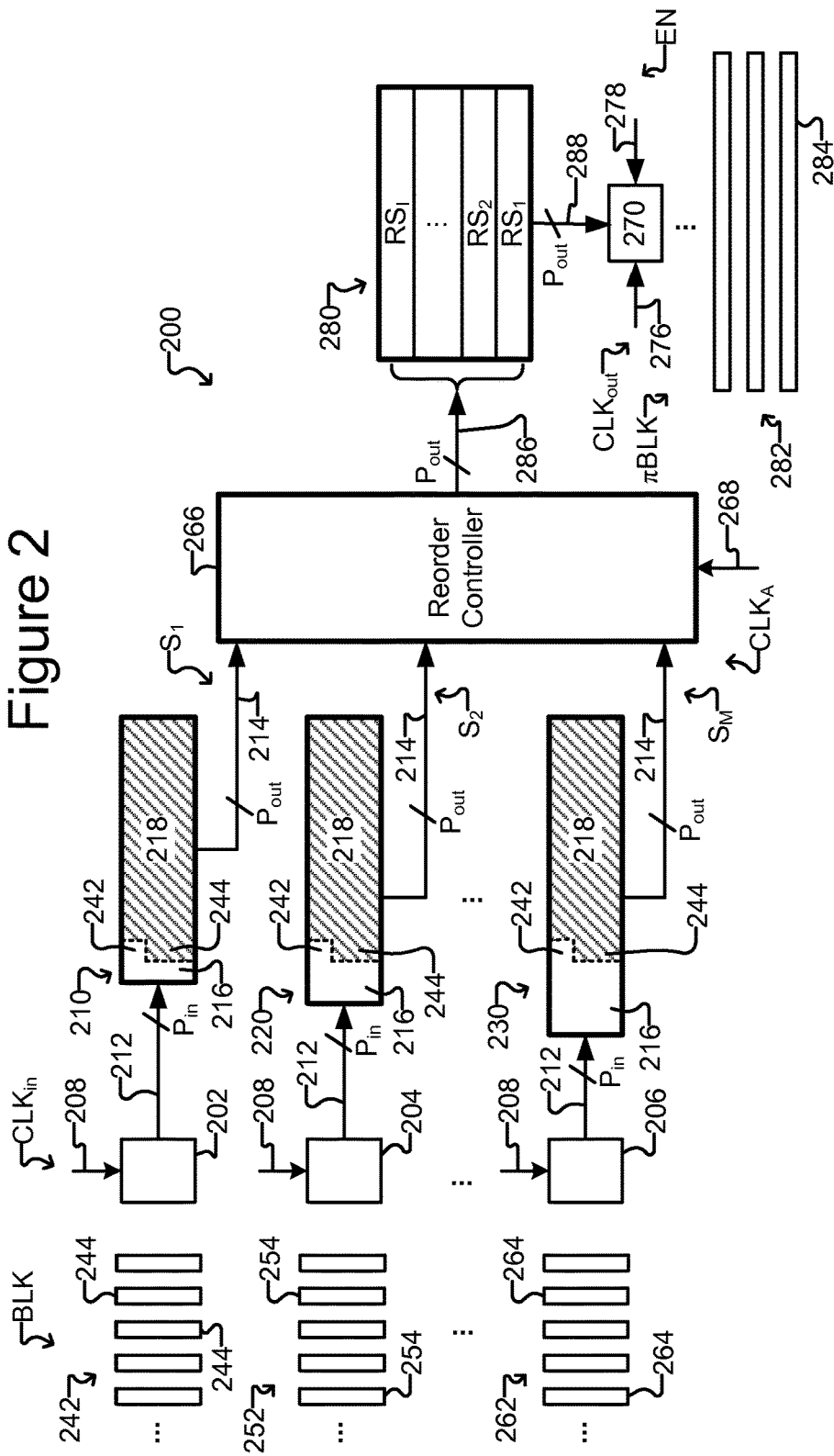
FIG. 2 shows an example configuration of the conversion/reorder circuit of FIG. 1 according to some embodiments of the invention.

FIG. 2 is an example configuration of the conversion/reorder circuit 102 of FIG. 1. As shown, the conversion/reorder circuit 200 of FIG. 2 can comprise M parallel-to-parallel conversion memories 210, 220, 230 each comprising a memory input 212 and a memory output 214; a reorder controller 266; and a reorder memory 280.

In FIG. 2, input modules 202, 204, 206 are shown connected to the memory inputs 212 of the conversion memories 210, 220, 230, and an output module 270 is connected to an output 288 of the reorder memory 280. Each input module 202, 204, 206 can receive and load into a corresponding conversion memory 210, 220, 230 a input stream 242, 252, 262 of $P_{in}$-parallel-data segments 244, 254, 264 of data elements of a data block BLK. The output module 270 can output from the reorder memory 280 a permuted version of the data block πBLK in which the data elements are reordered and output in a stream 282 of $P_{out}$-parallel-data segments 284.

The input modules 202, 204, 206 and their clock ports 208 can be the input modules 110, 120, 130 with their clock ports 116 of FIG. 1, and the output module 270 and its clock port 276 and enable port 278 can be the output module 170 with its clock port 176 and enable port 178 of FIG. 1. Similarly, the input streams 242, 252, 262 of $P_{in}$-parallel-data segments 244, 254, 264 in FIG. 2 can be the input streams 142, 152, 162 of $P_{in}$-parallel-data segments 144, 154, 164 in FIG. 1, and the output stream 282 of $P_{out}$-parallel-data segments 284 in FIG. 2 can be the output stream 182 of $P_{out}$-parallel-data segments 184 in FIG. 1.

Each conversion memory 210, 220, 230 can comprise a memory input 212 connected to one of the input modules 202, 204, 206 and a memory output 214. The memory input 212 can be $P_{in}$ data elements wide, and the memory output 214 can be $P_{out}$ data elements wide. Each memory 210, 220, 230 can comprise buffer space 216 and a $P_{out}$ space 218. The $P_{out}$ space 218 can comprise sufficient storage for $P_{out}$ number of data elements. The $P_{out}$ space 218 in each conversion memory 210, 220, 230 can be connected to its memory output 214 and configured to output all of the $P_{out}$ data elements in the $P_{out}$ space 218 in parallel on a cycle of the clock $CLK_A$. Thus, after the $P_{out}$ space 218 in each conversion memory fills with data elements from the input streams 242, 252, 262, the data elements in the filled $P_{out}$ space 218 can be read from the conversion memory in $P_{out}$-parallel-data segments, which are referred to herein as intermediate $P_{out}$-parallel-data segments and identified in FIG. 2 as intermediate $P_{out}$-parallel-data segments $S_1$, $S_2$, ..., $S_M$.

Each conversion memory 210, 220, 230 can comprise a two-dimension array of rows and columns of memory cells (not shown) in which each memory cell is configured to store one of the data elements of the $P_{in}$-parallel-data segments 244, 254, 264. Each conversion memory 210, 220, 230 can thus be a memory cell array. For example, each conversion memory 210, 220, 230 can comprise $P_{in}$ number of such rows and at least $]P_{out}/P_{in}[$ number of such columns. $P_{out}$ can be greater than or equal to $P_{in}$. Each new $P_{in}$-parallel-data segments 244, 254, 264 from an input stream 242, 252, 262 can be written into the first column (e.g., the left most column in FIG. 2) of its respective conversion memory 210, 220, 230 while the contents of the memory 210, 220, 230 are shifted (e.g., to the right in FIG. 2) one column away from the first column on successive cycles of the clock $CLK_A$. Alternatively, rather than shift the contents of each memory 210, 220, 230, the addresses of the memories 210, 220, 230 can be manipulated to achieve the same effect. After the $P_{out}$ space 218 fills in one of the conversion memories 210, 220, 230, the contents of the filled $P_{out}$ space 218 can be read out as one of the intermediate $P_{out}$-parallel-data segments $S_1$, $S_2$, $S_M$. In some embodiments, the size of a buffer space 216 in each conversion memory 210, 220, 230 can be different. For example, the buffer space 216 of successive conversion memories 210, 220, 230 can have one more column than a previous one of the conversion memories 210, 220, 230 so that the $P_{out}$ memory space of successive conversion memories 210, 220, 230 fill on successive cycles of the clock $CLK_A$.

$P_{out}/P_{in}$ can be an integer or a non-integer. If $P_{out}/P_{in}$ is not an integer, then a column of each conversion memory 210, 220, 230 will comprise a first portion 242 that is part of the buffer space 216 and a second portion 244 that is part of the $P_{out}$ space 218. When an intermediate $P_{out}$-parallel-data segment $S_1$, $S_2$, $S_M$ is read from the $P_{out}$ space 218, data elements in the second portion 244 are read out as part of the intermediate $P_{out}$-parallel-data segment $S_1$, $S_2$, $S_M$, but the data elements in the first portion 242 are left behind. The corresponding column of the conversion memory 210, 220, 230 will thus be only partially filled as the process of writing new $P_{in}$-parallel-data segments 244, 254, 264 into the conversion memory 210, 220, 230 begins again. To remedy this situation, selectors (e.g., multiplexors) (not shown) can be disposed between the last full column of the buffer space 216, the column comprising the first and second portions 242, 244, and the first full column of the $P_{out}$ space 218. Such selectors (not shown) can, for example, shift the data elements from the first portion 242 to the second portion 244 and shift some of the data elements from the last full column of the buffer space 216 into any still empty parts of the first portion 242 and the second portion 244.

Each conversion memory 210, 220, 230 can be an individual digital memory (e.g., a random access memory (RAM), shift registers, flip-flops, or the like). As another example, each conversion memory 210, 220, 230 can be a block of storage space in an individual digital memory (e.g., a RAM, shift registers, flip-flops, or the like). As yet another example, each conversion memory 210, 220, 230 can comprise a plurality of individual digital memories (e.g., RAMs, shift registers, flip-flops, or the like).

The reorder controller 266 and the reorder memory 280 can perform a $P_{out}$-segment reorder of the data elements of the data block BLK. A $P_{out}$-segment reorder can move one or more of the data elements an integer multiple of $P_{out}$ places in the order. In other words, one or more of the data elements (e.g., one, two, three, four, five, or more) in the reordered block (e.g., the permuted data block πBLK) can be i*$P_{out}$ places from their positions in the original order of the data elements (e.g., input data block BLK), where i is an integer greater than or equal to one (e.g., one, two, three, four, five, or more). In some embodiments, the reorder controller 262 and/or the reorder memory 280 can be configured to process sub-sections (e.g., the information portion or the parity portion) of the block BLK. In some embodiments, a $P_{out}$-segment reorder of the data elements of the received data block BLK can be a first reorder that results in the data elements being in a second order compared to a first order in which the data elements are received in the data block BLK.

The reorder controller 266 and reorder memory 280 can perform a $P_{out}$-segment reorder of the data elements by selectively changing the order of a plurality of the intermediate $P_{out}$-parallel-data segments $S_1$, $S_2$, $S_M$ so that those parallel data segments appear in any desired order in the output stream 282. The intermediate $P_{out}$-parallel-data segments $S_1$, $S_2$, $S_M$ will be some of the $P_{out}$-parallel-data segments 284 in the output stream 282, and the reorder controller 266 and reorder memory 280 can thus control the order in which the intermediate $P_{out}$-parallel-data segments $S_1$, $S_2$, $S_M$ appear in the output stream 282. For example, the reorder memory 280 can comprise I $P_{out}$ data-element-wide storage sections $RS_1$ to $RS_I$. The reorder controller 266 can be configured to write each of the intermediate $P_{out}$-parallel-data segments $S_1$, $S_2$, $S_M$ from the outputs 214 of the memories 210, 220, 230 into any of the $P_{out}$ data-element-wide storage sections $RS_1$ to $RS_I$ (e.g., as specified on a signal received at control input 268), and the output module 270 can be configured to read the contents of the storage sections $RS_1$ to $RS_I$ in order to produce the output stream 182.

Figure 3:
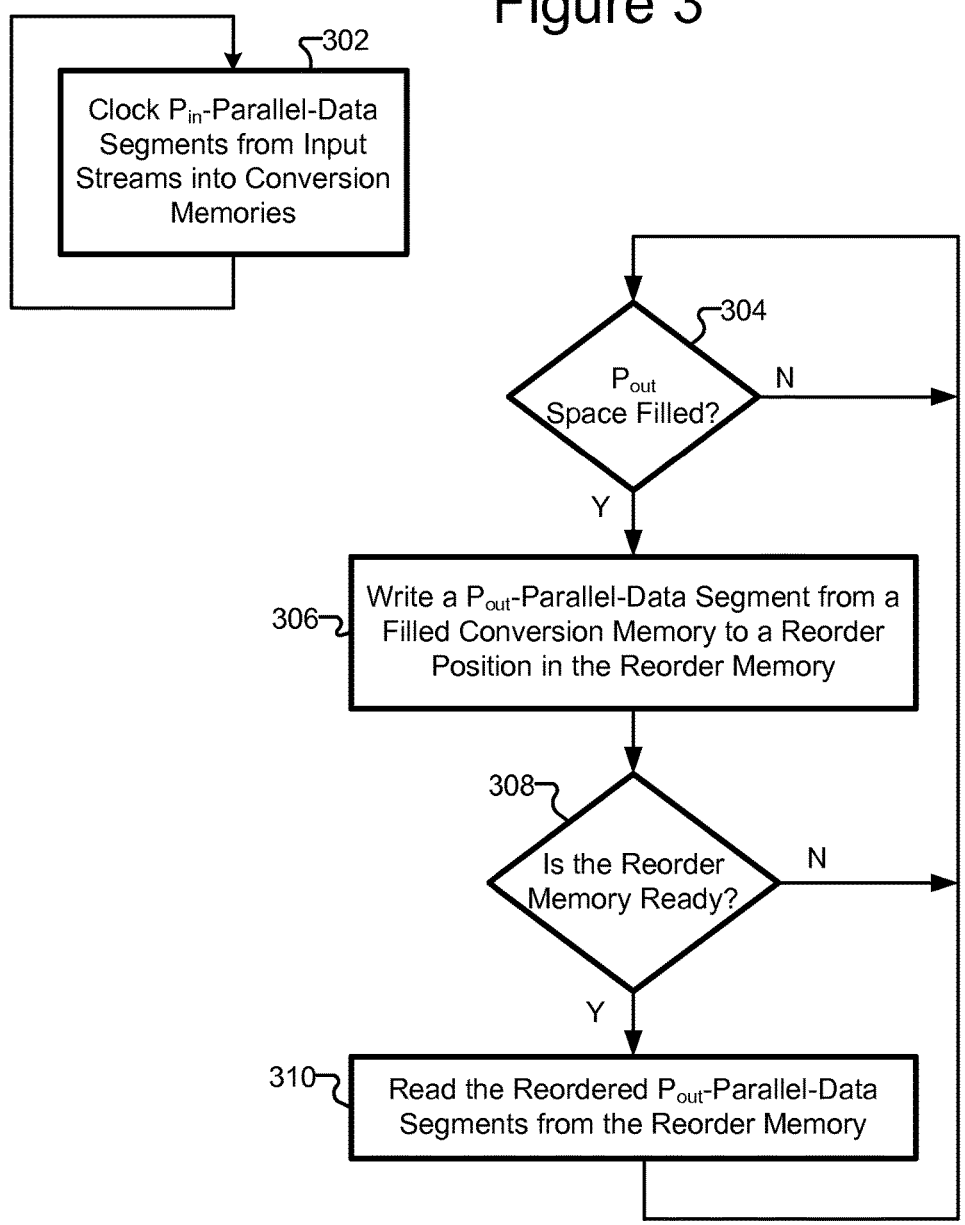
FIG. 3 is a process illustrating an example of operation of the conversion/reorder circuit of FIG. 2 according to some embodiments of the invention.

FIG. 3 illustrates a process 300 that is an example of operation of the conversion reorder circuit 200 of FIG. 2.

At step 302, the process 300 can sequentially write on successive cycles of the clock $CLK_{in} P_{in}$-parallel-data segments 244, 254, 264 from each input stream 242, 252, 262 into the conversion memories 210, 220, 230. The process 300 can repeatedly perform step 302 so that the input modules 202, 204, 206 repeatedly write $P_{in}$-parallel-data segments 244, 254, 264 from the input streams 242, 252, 262 into the conversion memories 210, 222, 230. While doing so, the process 300 can determine at step 304 after the $P_{out}$ space 218 in a conversion memory 210, 220, 230 fills, which can cause the process 300 to proceed from step 304 to step 306. Note that step 302 can continue to be performed even as steps 304-310 are performed.

At step 306, the process 300 can write an intermediate $P_{out}$-parallel-data segment $S_1$, $S_2$, $S_M$ from the filled $P_{out}$ space 218 of one of the conversion memories 210, 220, 230 into one of the storage section $RS_1$, $RS_2$, $R_I$ of the reorder memory 280, effecting a $P_{out}$ reorder of the data elements of the data block BLK as discussed above.

At step 308, the process 300 can determine whether the reorder memory 280 is ready (e.g., filled). If not, the process 300 can return to step 304 and repeat steps 306 to 308 until the reorder memory 280 is ready. Once the reorder memory 280 is ready and/or other criteria are met (e.g., a subsequent processing unit is ready), the process 300 can proceed from step 308 to step 310 and read the intermediate $P_{out}$-parallel-data segments $S_1$, $S_2$, . . . sequentially from the reorder memory 280 to produce the output stream 282 as discussed above. Step 310 can be performed by enabling the output module 270 with an enable signal EN on the enable port 278. After step 310, the process 300 can disable the output module 270.

Figure 4:
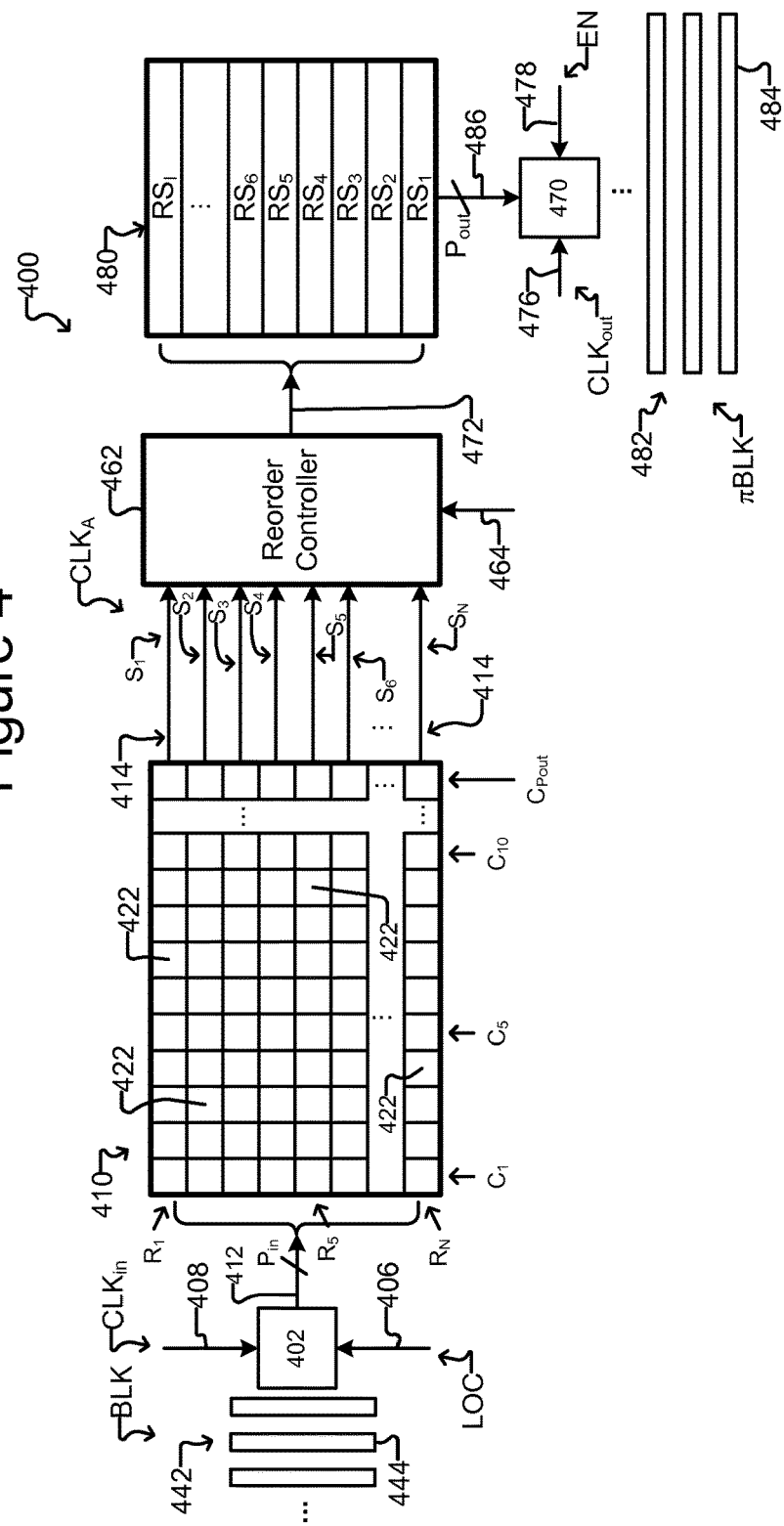
FIG. 4 illustrates another example configuration of the conversion/reorder circuit of FIG. 1 according to some embodiments of the invention.

FIG. 4 illustrates another example configuration of the conversion/reorder circuit 102 of FIG. 1. As shown, the conversion/reorder circuit 400 can comprise a memory cell array 410, a reorder controller 462, and a reorder memory 480. The reorder controller 462 and reorder memory 480 can be generally similar to or the same as the reorder controller 266 and reorder memory 280 in FIG. 2. Although one memory cell array 410 connected to one input module 402 is shown, there can be additional such memories each connected to additional input modules.

FIG. 4 shows a memory input 412 to the memory cell array 410 connected to an input module 402 comprising a clock port 408 for the clock $CLK_{in}$ and a location port 406 for a location LOC signal. FIG. 4 also shows an output 486 of the reorder memory 480 connected to an output module 470 comprising a clock port 476 for the clock $CLK_{out}$ and an enable port 478 for an enable signal EN. The input module 402 and its clock port 408 and location port 406 can be one of the input modules 110, 120, 130 with its clock port 116 and location port 118 of FIG. 1, and the output module 470 and its clock port 476 and enable port 478 can be the output module 170 with its clock port 176 and enable port 178 in FIG. 1. Similarly, the input stream 442 of $P_{in}$-parallel-data segments 444 in FIG. 4 can be any of the input streams 142, 152, 162 of $P_{in}$-parallel-data segments 144, 154, 164 in FIG. 1, and the output stream 482 of $P_{out}$-parallel-data segments 484 in FIG. 4 can be the output stream 182 of $P_{out}$-parallel-data segments 184 in FIG. 1.

The memory cell array 410 can perform both a $P_{in}$-to-$P_{out}$ parallel conversion and a q-reorder on an input block BLK of ordered data elements received in a stream 442 of $P_{in}$-parallel-data segments 444. The $P_{in}$-to-$P_{out}$ parallel conversion can achieve the same result as the $P_{in}$-to-$P_{out}$ parallel conversion discussed above with respect to FIGS. 2 and 3. In some embodiments, a q-reorder of an ordered block of q*p data elements changes the order of the data elements from a first order having an order index i from 0 to (q*p)−1 to a second order having an order index i'=p*mod(i/q)+[i/q], where as noted above, [i/q] is the floor function of i/q. In some embodiments, p can be $P_{out}$. As discussed below, in some embodiments, the input block BLK can be a sub-block of the parity data elements of a received message data block. In such an embodiment, q*p can be the number of parity data elements in the parity sub-block.

In some embodiments, the foregoing q-reorder of the data elements of the received data block BLK can be a first reordering operation that puts the data elements into a second order that is different than the first order in which the data elements are received in the data block BLK. The reorder controller 462 and reorder memory 480 can then perform a second reordering of the data elements, which can put the data elements into a third order in the permuted data block πBLK. For example, the reorder controller 462 and reorder memory 480 can perform the $P_{out}$-segment reorder (as discussed above with respect to FIG. 2) on a plurality of the intermediate $P_{out}$-parallel-data segments $S_1$ to $S_q$ output from rows $R_1$ to $R_q$ of the memory cell array 410. As noted above with respect to the reorder controller 262 and the reorder memory 280, in some embodiments, the reorder controller 462 and the reorder memory 480 can be configured to process sub-sections (e.g., the information portion or the parity portion) of the block BLK.

The memory cell array 410 can comprise a $P_{in}$-data-element-wide memory input 412, and a plurality of $P_{out}$-data-element-wide outputs 414. Each of the cells 422 of the memory cell array 410 can be individually addressable and configured to store one of the data elements of the $P_{in}$-parallel-data segments 444. The memory cell array 410 can comprise N*$P_{out}$ memory cells 422, which can be organized into rows and columns. In the example illustrated in FIG. 4, the memory cell array 410 is organized into N rows $R_1$ to $R_N$ and $P_{out}$ columns $C_1$ to $C_{Pout}$. N can be greater than or equal to q, which as discussed above, can be the parameter of a q-reorder. N can also be greater than or equal to $P_{in}$.

The memory input 412 can be connected to the input module 402, which can write $P_{in}$-parallel-data segments 444 of the input stream 442 into the memory cell array 410. The input module 402 can write a $P_{in}$-parallel-data segment 444 on a single cycle of the clock $CLK_{in}$ into a group of $P_{in}$ memory cells 422 specified by a location LOC at the location port 406. (Hereinafter a group of $P_{in}$ cells 422 (e.g., contiguous cells 422) is referred to as a "$P_{in}$-memory segment.") Each output 414 can be connected to one of the N rows $R_1$ to $R_N$, and the memory cell array 410 can be configured to output in parallel on one cycle of the clock $CLK_A$ all $P_{in}$ of the data elements in one of the rows $R_1$ to $R_N$ at the corresponding output 414. This can result in an intermediate $P_{out}$-parallel-data segment $S_1$ to $S_N$ output at each output 414.

As will be seen, the location LOC at the location port 406 of the input module 402 can be incremented on successive cycles of the clock $CLK_{in}$ so that the memory cells 422 of the memory cell array 410 are filled in the following sequence: each column $C_1$ to $C_{Pout}$ is filled from the first row $R_1$ to the $q^{th}$ row $R_q$, and the columns $C_1$ to $C_{Pout}$ are filled from the first column $C_1$ to the last column $C_{Pout}$, wrapping a $P_{in}$-parallel-data segment 444 from the $q^{th}$ row $R_q$ of one column (e.g., $C_1$) to the first row $R_1$ of the next column (e.g., $C_2$) as needed. Rows $R_{(q+1)}$ to $R_N$ are not filled. As rows $R_1$ to $R_q$ fill, the data elements in each filled row $R_1$ to $R_q$ can be read in parallel to produce a $P_{out}$-parallel-data segment $S_1$ to $S_q$ at the corresponding first q of the outputs 414. The foregoing can effect not only the to $P_{in}$-to-$P_{out}$ parallel conversion of the input data block BLK discussed above, but can also impart a q-reorder of the data elements.

The reorder controller 462 and reorder memory 480 can be and function the same as or similar to the reorder controller 266 and reorder memory 280 of FIG. 2. The reorder controller 462 and reorder memory 480 can thus perform a $P_{out}$-segment reorder of the data elements by selectively changing the order of the intermediate $P_{out}$-parallel-data segments $S_1$ to $S_q$ output 414 from the filled rows $R_1$ to $R_q$ of the memory cell array 410 so that those parallel data segments appear in any desired order in the output stream 482. For example, the reorder memory 280 can comprise I $P_{out}$-data-element-wide storage sections $RS_1$ to $RS_I$, and the output module 470 can be configured to read the contents of the storage sections $RS_1$ to $RS_I$ in order to produce the output stream 482 generally as discussed above with respect to reorder controller 266 and reorder memory 280 of FIG. 2. The reorder controller 462 can thus change the order of the intermediate $P_{out}$-parallel-data segments from $S_1$ to $S_q$ in the output stream 482 by controlling (e.g., as specified on a signal received at control input 464) which of the storage sections $RS_1$ to $RS_I$ each intermediate $P_{out}$-parallel-data segment $S_1$ to $S_q$ is written to.

Figure 5:
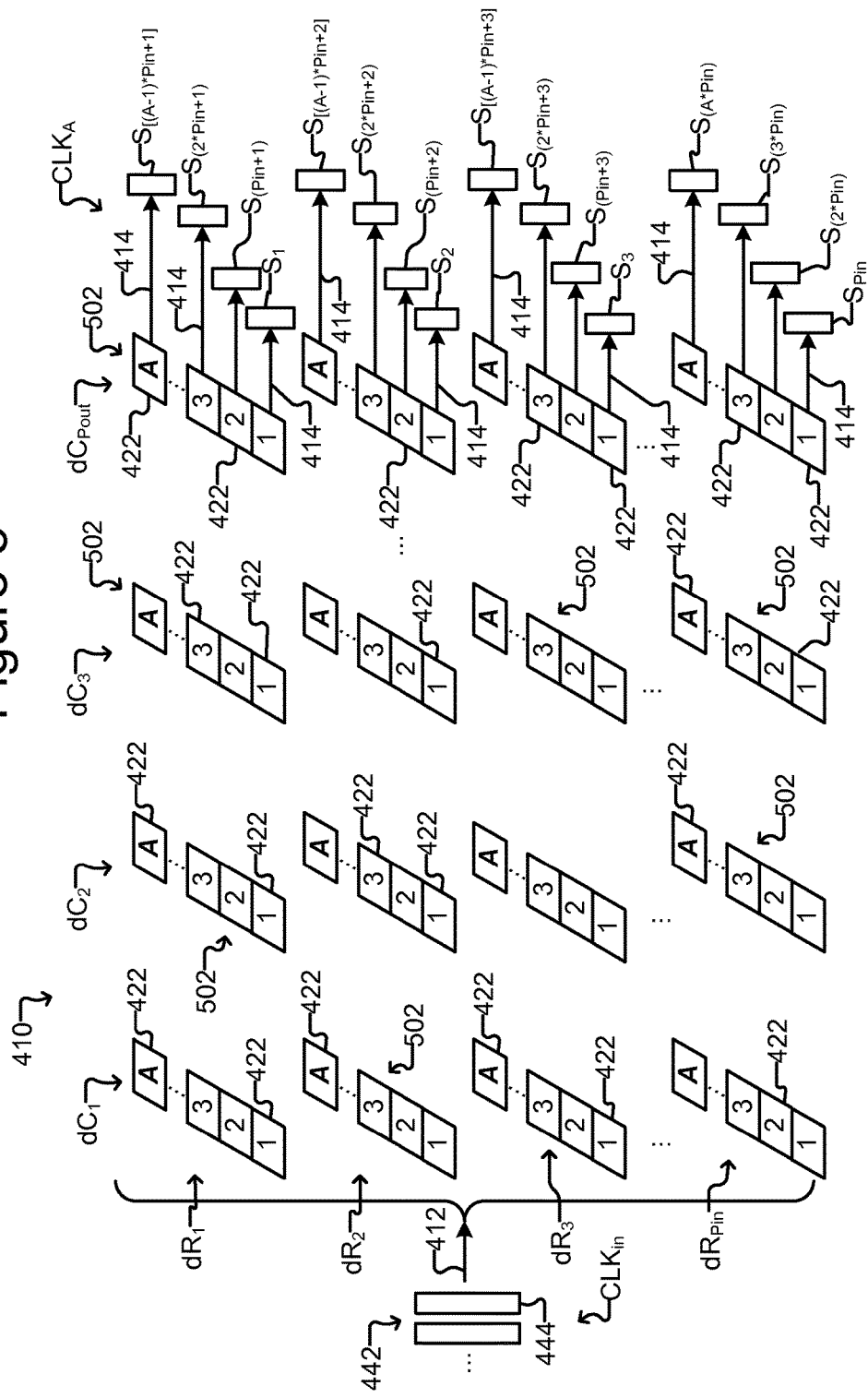
FIG. 5 is an example configuration of the memory cell array of FIG. 4 according to some embodiments of the invention.

In FIG. 4, the memory cell array 410 is depicted as a two-dimensional array of the memory cells 422. So configured the memory cell array 410 can comprise one memory device (e.g., a random access memory (RAM), a memory device comprising shift registers, a memory device comprising flip flops, or the like) or a plurality of such memory devices arranged to function as a two-dimensional array of the memory cells 422. FIG. 5 illustrates an example of the memory cell array 410 configured as a three-dimensional array of the memory cells 422.

In the example illustrated in FIG. 5, the memory cell array 410 comprises W rows and $P_{out}$ columns of multi-cell memory devices 502. Each memory device 502 comprises A memory cells 422, where A is greater than one and W*A is greater than or equal to the maximum possible value of q. In some embodiments, the number of rows W can be $P_{in}$. For ease of discussion and illustration, the number of rows W is depicted as $P_{in}$ in the drawings and in the discussions below, but W can be other integers. In the drawings and below, the rows of memory devices 502 are referred to as "dR" and the columns are referred to as "dC" to distinguish from the rows R and columns C of memory cells 422 in FIG. 4.

Configured as shown in FIG. 5, the memory cell array 410 can thus be a $P_{in}$-by-$P_{out}$-by -A three-dimensional array of the memory cells 422. The third dimension (A) can be the address (e.g., all or part of the LOC signal illustrated in FIG. 4) selecting one of the A locations of the memory cells 422 of one or more of the memory devices 502. Each memory device 502 can be configured such that one and only one of its memory cells 422 can be selected and written to or read from on any given cycle of its corresponding clock (e.g., $CLK_{in}$ or $CLK_A$). In some embodiments, each memory device 502 can be a RAM or other memory device such as a memory device comprising shift registers, a memory device comprising flip flops, or the like.

In the example configuration of the memory cell array 410 illustrated in FIG. 5, a $P_{in}$-parallel-data segment 444 from the input stream 442 can be written through the memory input 412 into $P_{in}$ of the memory cells 422 on a cycle of the clock $CLK_{in}$ by selecting one of the memory cells 422 in each of $P_{in}$ different ones of the memory devices 502. For example, one of the memory cells 422 can be selected in $P_{in}$ of the memory devices 502 in different rows $dR_1$ to $dR_{Pin}$ and/or different columns $dC_1$ to $dC_{Pout}$ of the memory devices 502. Similarly, an intermediate $P_{out}$-parallel-data segment $S_1$ to $S_{(A*Pin)}$ (which are equivalent $S_1$ to $S_N$ in FIG. 4) can be read through one of the memory outputs 414 from $P_{out}$ of the memory cells 422 on one cycle of the clock $CLK_A$ by selecting one of the memory cells 422 in each of $P_{out}$ different ones of the memory devices 502. For example, the same memory cell 422 location can be selected in each of the $P_{out}$ memory devices 502 in one of the rows $dR_1$ to $dR_{Pin}$ of the memory devices 502.

The filling order of the memory cells 422 in FIG. 5 can be from column $dC_1$ to column $dC_{Pout}$, where the filling order of each column $dC_1$ to $dC_{Pout}$ is as follows: the memory cells 422 in the first location 1 of each memory device 502 of the column in order from the first row $dR_1$ to the last row $dR_{Pin}$; then the memory cells 422 at the second location 2 in each memory device 502 of the column in order from the first row $dR_1$ to the last row $dR_{Pin}$; then the memory cells 422 at the third location 3 in each memory device 502 from the first row $dR_1$ to the last row $dR_{Pin}$; and so on until the memory cells 422 at the $A^{th}$ location in each memory device 502 of the column from the first row $dR_1$ to the last row $dR_{Pin}$. A $P_{in}$-to-$P_{out}$ parallel conversion and a q-reorder can be effected on the data block BLK by writing the $P_{in}$-parallel-data segments 444 into each column $dC_1$ to $dC_{Pout}$ only to its $q^{th}$ memory cell 422 and then wrapping from the $q^{th}$ memory cell 422 of one column (e.g., $dC_1$) to the first memory cell 422 of the next column (e.g., $dC_2$).

The $q^{th}$ memory cell 422 in each column $dC_1$ to $dC_{Pout}$ can be as follows: the memory cell 422 at location x of the memory device 502 in row y $dR_y$, where x=]q/$P_{in}$[; and y=mod((q−1)/$P_{in}$)+1.

The order of reading intermediate $P_{out}$-parallel-data segments $S_1$ to $S_N$ from the memory cell array 410 configured as shown in FIG. 5 can be as follows: all of the data elements in the memory cells 422 at location 1 in the memory devices 502 in row $dR_1$, then $dR_2$, then $dR_3$, etc., then the last row $dR_{Pin}$ are read in order to produce intermediate $P_{out}$-parallel-data segments in order $S_1$, $S_2$, $S_3$, etc., $S_{Pin}$. The foregoing is then repeated for location 2 in the memory devices 502 to produce in order intermediate $P_{out}$-parallel-data segments $S_{(Pin+1)}$, $S_{(Pin+2)}$, $S_{(Pin+3)}$, etc., $S_{(2*Pin)}$ and then again for location 3 in the memory devices 502 to produce in order intermediate $P_{out}$-parallel -data segments $S_{(2*Pin+1)}$, $S_{(2*Pin+2)}$, $S_{(2*Pin+3)}$, etc., $S_{(3*Pin)}$. The foregoing is continued for each memory location of the memory devices 502 to location A, which produces in order intermediate $P_{out}$-parallel-data segments $S_{((A-1)*Pin+1)}$, $S_{((A-1)*Pin+2)}$, $S_{((A-1)*Pin+3)}$, etc., $S_{(A*Pin)}$. As noted above, A*$P_{in}$=N, and $S_{(A*Pin)}$ is thus $S_N$ (compare FIGS. 4 and 5).

As discussed above, in actual use, the memory cell array 410 configured as illustrated in FIG. 5 is filled only to the $q^{th}$ memory cell 422 in each column $dC_1$ to $dC_{Pout}$. For this reason, in actual use, the foregoing reading of intermediate $P_{out}$-parallel-data segments $S_1$ . . . is performed in the foregoing order but only to the location of the $q^{th}$ memory cell 422 in each column $dC_1$ to $dC_{Pout}$, producing only q intermediate $P_{out}$-parallel-data segments $S_1$ to $S_q$. (See the explanation above of the $q^{th}$ memory cell 422.) The intermediate $P_{out}$-parallel-data segments $S_1$ to $S_q$ can be written by the reorder controller 462 into the reorder memory 480 as discussed above.

FIG. 6 illustrate a process 600 that is an example of operation of the conversion/reorder circuit 400 of FIG. 4. At step 602, the process 600 can identify a next empty $P_{in}$-memory segment in the memory cell array 410, and at step 604 the process 600 can write the next $P_{in}$-parallel-data segment 444 from the input stream 442 into the next empty $P_{in}$-memory segment. As illustrated by step 606, the process 600 can repeat steps 602, 604 until the memory cell array 410 is deemed ready, which can be, for example, when the memory cell array 410 contains q intermediate $P_{out}$-parallel-data segments $S_1$ to $S_q$.

FIGS. 7-11 illustrate an example of performing steps 602-606 on the memory cell array 410 configured as a two-dimension array of memory cells 422 as shown in FIG. 4. FIGS. 8-12 show an example of steps 602-606 in which the memory cell array 410 is configured as illustrated in FIG. 5. In both of the examples illustrated in FIGS. 7-16, $P_{in}$ is 8, $P_{out}$ is 45, and q is 11. The foregoing numerical values are examples only and provided solely for ease of illustration and discussion but not by way of limitation.

As shown in FIG. 7, the memory cell array 410 configured as shown in FIG. 4 is initially empty. Consequently, at step 602, the next $P_{in}$-memory segment 702 can be the memory cells 422 in the first eight rows $R_1$ to $R_8$ of the first column $C_1$. Because q is eleven, the next empty $P_{in}$-memory segment 702 does not wrap from one column to the next. FIG. 8 shows the next $P_{in}$ parallel-data segment $444_i$, from the input stream 442 written at step 604 into the empty $P_{in}$-memory segment 702 identified at step 602.

At step 606, the process 600 branches back to repeat steps 602, 604. At the next repetition of step 602, the process 600 identifies the next empty $P_{in}$-memory segment 802 as comprising a first portion 802a in the first column $C_1$ and a second portion 802b in the second column $C_2$. Because q is eleven, the memory cell array 410 configured as shown in FIG. 4 fills each column $C_1$ to $C_{Pout}$ only to the eleventh row $R_{11}$. The next empty $P_{in}$-memory segment 802 thus wraps from the first column $C_1$ at the eleventh row $R_{11}$ to the first row $R_1$ of the second column $C_2$ as shown in FIG. 8. At step 604, the process 600 writes the next $P_{in}$-parallel-data segment $444_{(i+1)}$ from the input stream 442 into the $P_{in}$-memory segment 802 as illustrated in FIG. 9.

As shown in FIG. 9, at the next repetition of step 602, the process 600 identifies the next empty $P_{in}$-memory segment 902 as comprising a first portion 902a comprising the memory cells 422 corresponding to rows $R_6$ to $R_{11}$ of the second column C2 and a second portion 902b comprising rows $R_1$, $R_2$ of the third column $C_3$. At step 604, the process 400 can write the next $P_{in}$-parallel-data segment $444_{(i+2)}$ from the input stream 442 into the $P_{in}$-memory segment 902 as shown in FIG. 10. Also as shown in FIG. 10, after three repetitions of steps 602, 604, the process 600 has filled with data elements from $P_{in}$-parallel-data segments 444 the first two columns $C_1$, $C_2$ to the eleventh row $R_{11}$ and part of the third column $C_3$.

Figure 11:
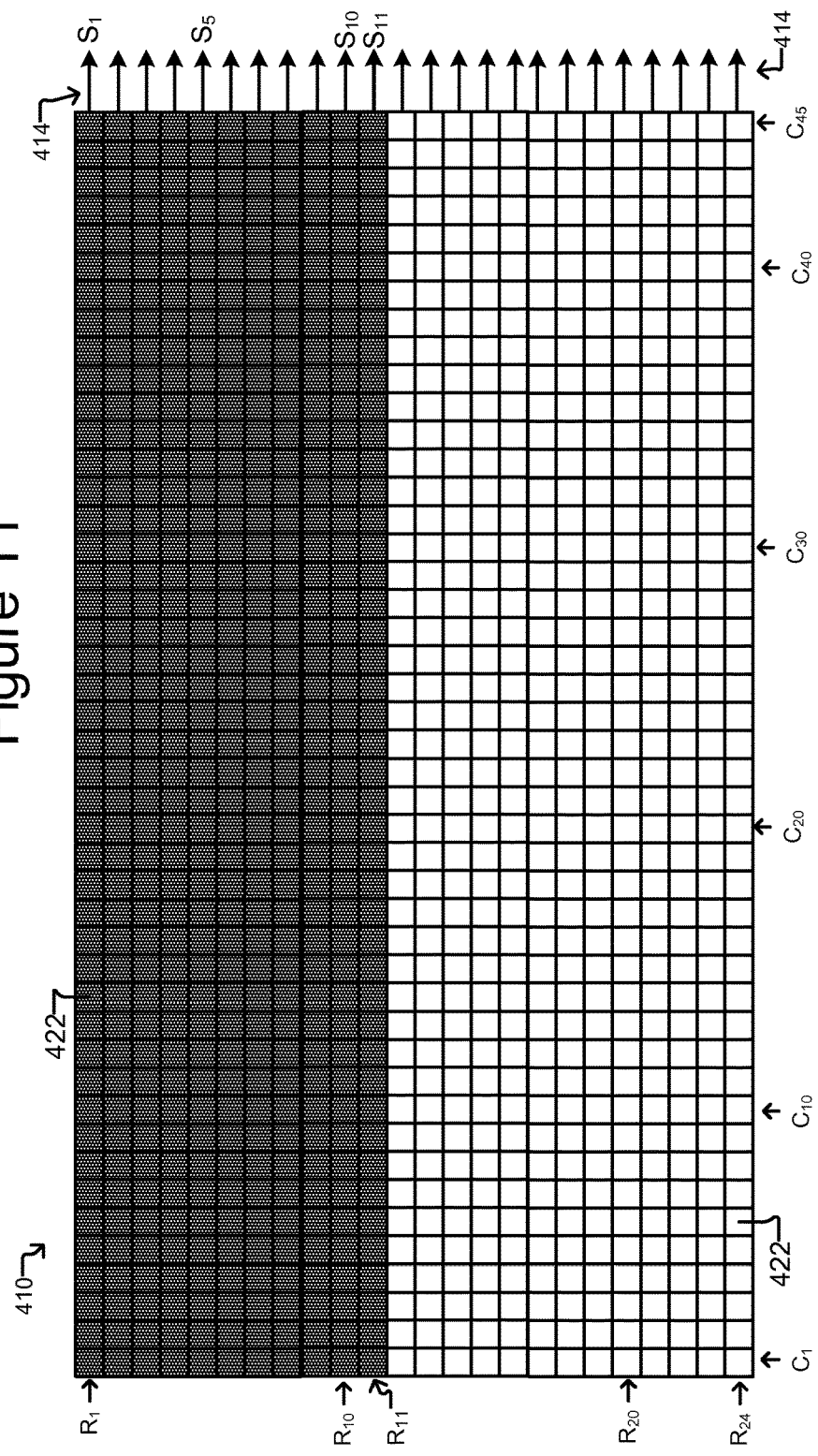
FIG. 11 shows the two-dimensional memory cell array of FIG. 4 filled to the $q^{th}$ row and illustrates reading the data elements from rows $R_1$ to $R_q$ as q intermediate $P_{out}$-parallel-data segments $S_1$ to $S_q$ according to some embodiments of the invention.

The process 600 can continue repeating steps 602, 604 until each column $C_1$ to $C_{Pout}$ is filled to the $q^{th}$ (eleventh) row $R_q$. FIG. 11 shows an example in which the memory cell array 410 is filled to the eleventh row $R_{11}$. So filled, the memory cell array 410 is deemed ready at step 606, and the process 600 proceeds to step 608.

As noted, FIGS. 12-16 illustrate an example of operation of steps 602-606 in which the memory cell array 410 is configured as a three-dimensional array as shown in FIG. 5.

As also noted above, in the example illustrated in FIGS. 12-16 $P_{in}$ is 8, $P_{out}$ is 45, and q is 11.

Figure 12:
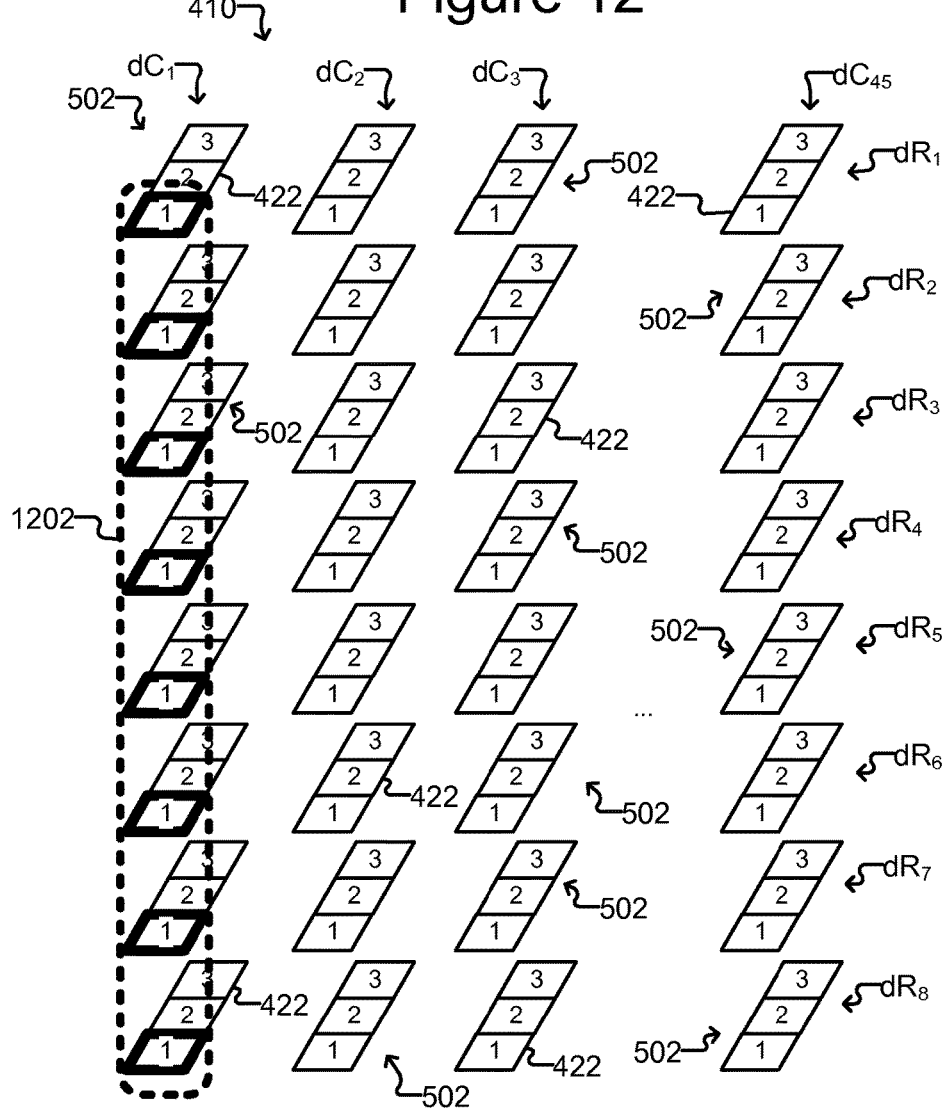
FIGS. 12-15 show an example of writing $P_{in}$-parallel-data segments into the three-dimensional memory cell array of FIG. 5 to fill the memory cell array to the $q^{th}$ memory cell in each column of memory devices according to some embodiments of the invention.
Figure 13:
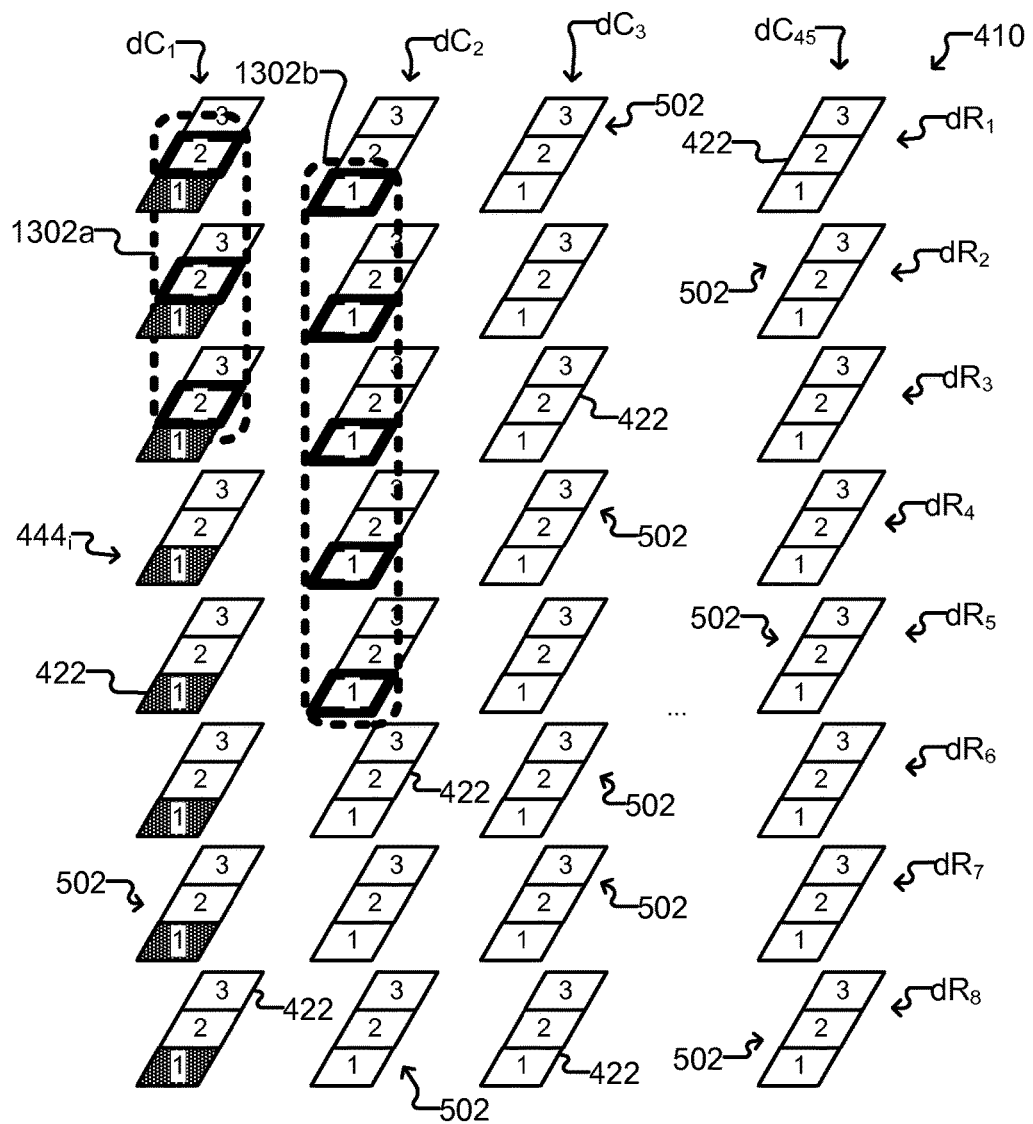

As shown in FIG. 12, the memory cell array 410 is initially empty. Consequently, the next empty $P_{in}$-memory segment 1202 identified at step 602 can be the eight memory cells 422 at location 1 in each of the memory devices 502 in the first column $dC_1$ of memory devices 502. Because q is 11, the next empty $P_{in}$-memory segment 1202 need not wrap. FIG. 13 shows the next $P_{in}$-parallel-data segment $444_i$, from the input stream 442 written at step 604 into the empty $P_{in}$-memory segment 1202 identified at step 602.

At step 606, the process 600 branches back to repeat steps 602, 604. As discussed above, the fill order of each column $dC_1$ to $dC_{45}$ can be the first memory cell 422 location 1 of the memory devices 502 in the column (e.g., $dC_1$) from row $dR_1$ to $dR_8$; then the second memory cell 422 location 2 of the memory devices 502 in the same column (e.g., $dC_1$) from row $dR_1$ to $dR_8$; and then the third memory cell 422 location 3 of the memory devices 502 in the same column (e.g., $dC_1$) from row $dR_1$ to $dR_8$. After filling the $q^{th}$ memory cell in a column (e.g., $dC_1$), however, the filling wraps to the first memory cell 422 in the next column (e.g., $dC_2$). Because q is eleven in the example illustrated in FIGS. 12-16, the $q^{th}$ memory cell 422 in each column $dC_1$ to $dC_{45}$ is the memory cell 422 at location 2 of the memory device 502 in row $dR_3$.

Figure 14:
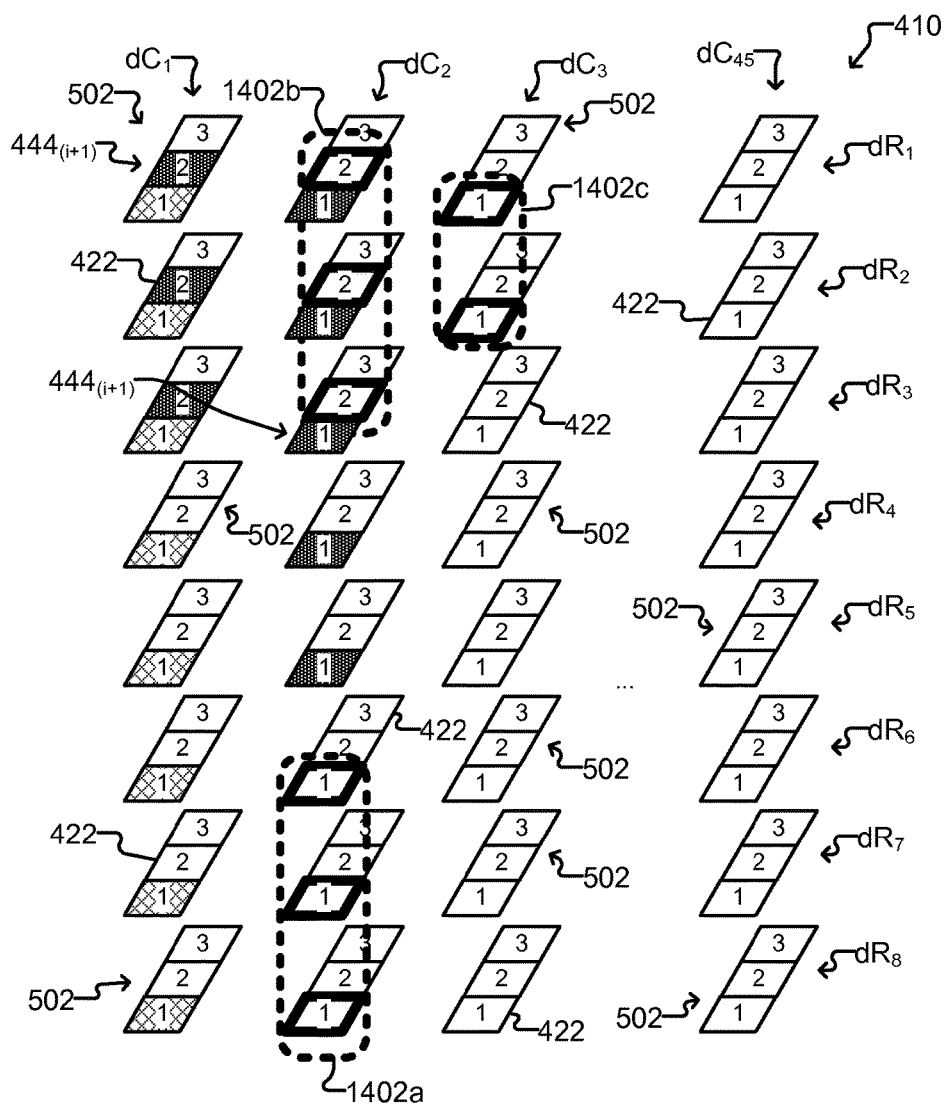

At the next repetition of step 602, the process 600 thus identifies the next empty $P_{in}$-memory segment 1302 as comprising a first portion 1302a in column $dC_1$ and a second portion 1302b in column $dC_2$. As shown in FIG. 13, the first portion 1302a comprises the memory cells 422 at location 2 in the memory devices 502 in rows $dR_1$ to $dR_3$ in column $dC_1$. The second portion 1302b comprises the memory cells 422 at location 1 in the memory devices 502 in rows $dR_1$ to $dR_5$ in column $dC_2$. At step 604, the process 600 writes the next $P_{in}$-parallel-data segment $444_{(i+1)}$ into the $P_{in}$-memory segment 1302 as illustrated in FIG. 14.

Figure 15:
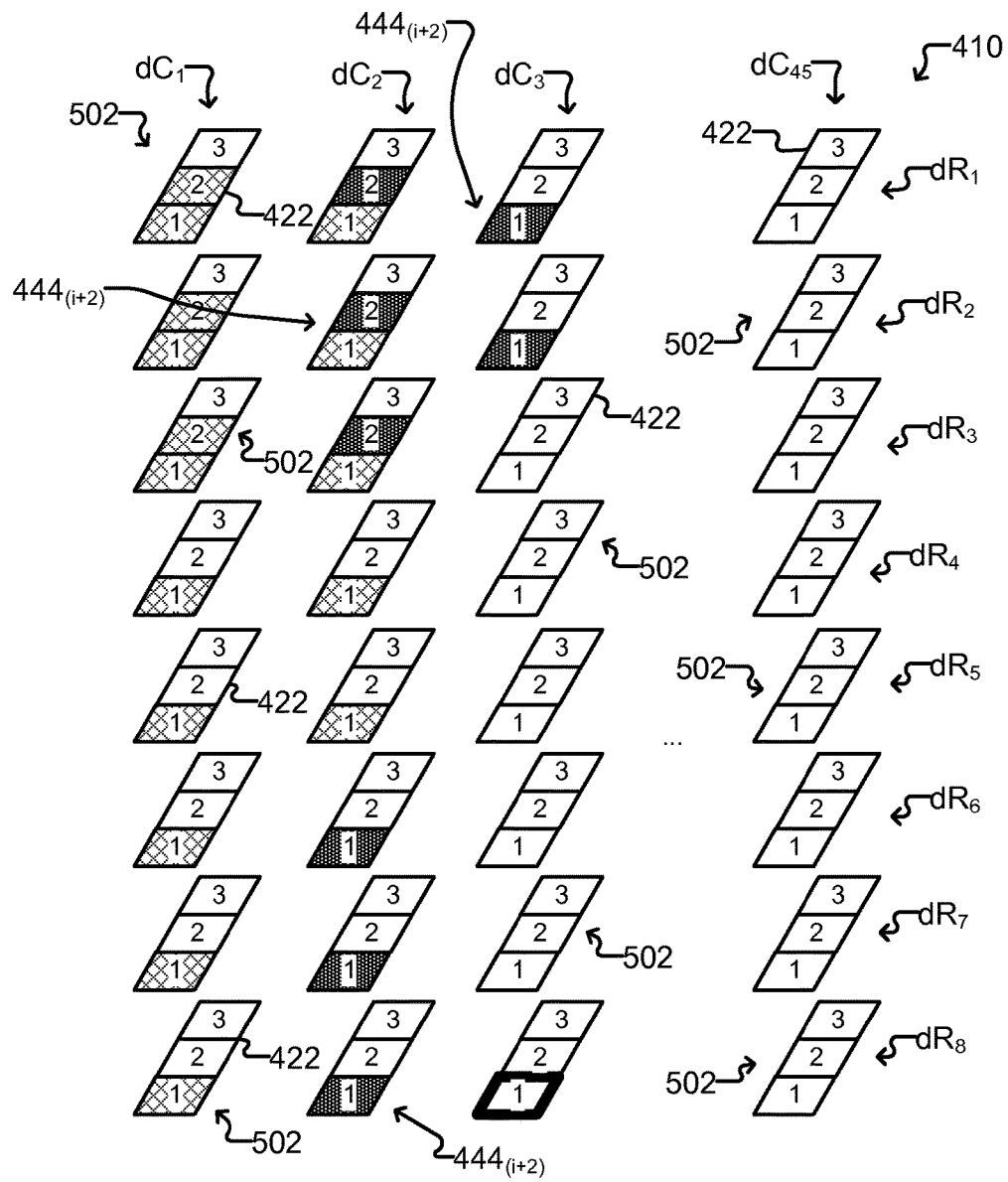

At the next repetition of step 602, the process 600 identifies the next empty $P_{in}$-memory segment 1402 as comprising a first portion 1402a in column $dC_2$, a second portion 1402b also in column $dC_2$, and a third portion 1402c in column $dC_3$. As shown in FIG. 14, the first portion 1402a comprises the memory cells 422 at location 1 in the memory devices 502 in rows $dR_6$ to $dR_8$ in column $dC_2$; the second portion 1404b comprises the memory cells 422 at location 2 in the memory devices 502 in rows $dR_1$ to $dR_3$ in column $dC_2$; and the third portion 1402c comprises the memory cells 422 at location 1 in the memory devices 502 in rows $dR_1$ and $dR_2$ in column $dC_3$. At step 604, the process 600 writes the next $P_{in}$-parallel-data segment $444_{(i+2)}$ into the $P_{in}$-memory segment 1402 as illustrated in FIG. 15.

Figure 16:
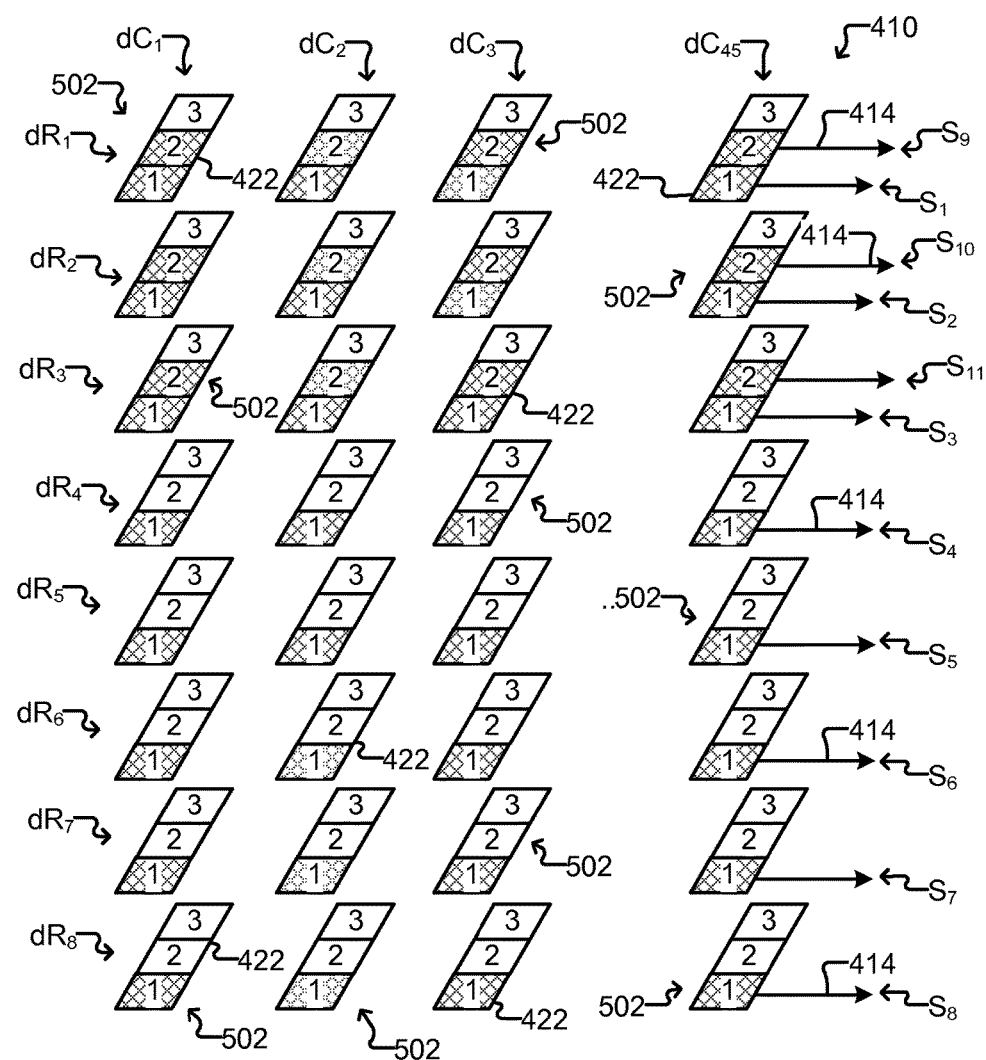
FIG. 16 shows the three-dimensional memory cell array of FIG. 5 filled to the $q^{th}$ memory cell in each column of memory devices and illustrates reading the data elements in q intermediate $P_{out}$-parallel-data segments $S_1$ to $S_q$ according to some embodiments of the invention.

The process 600 can continue repeating steps 602, 604 until each column $dC_1$ to $dC_{45}$ is filled to its $q^{th}$ memory cell 422, which as discussed above is the memory cell 422 at location 2 in the memory device 502 in row $dR_3$ of the column in the example shown in FIGS. 12-16. FIG. 16 illustrates an example showing each column $dC_1$ to $dC_{45}$ filled with data elements from the $P_{in}$-parallel-data segments 444 from location 1 of the memory device 502 in row $dR_1$ to location 2 of the memory device 502 in row $dR_3$ of the column. So filled, the memory cell array 410 is deemed ready at step 606, and the process 600 proceeds to step 608.

Returning now to FIG. 6, regardless of how steps 602-606 are performed (e.g., as in the example illustrated in FIGS. 7-11 or the example shown in FIGS. 12-16), at step 608, the process 600 can write q intermediate $P_{out}$-parallel-data segments $S_1$ to $S_q$ as discussed above from the first q outputs 414 of the memory cell array 410 into reorder positions in the reorder memory 480 and thus effect a $P_{out}$-segment reorder of the data elements of the data block BLK as discussed above with respect to the reorder memory 280, 480. For example, at step 608, the process 600 can read the intermediate $P_{out}$-parallel-data segments $S_1$-$S_{11}$ from outputs 414 of the memory cell array 410 illustrated in FIG. 11 and write those intermediate $P_{out}$-parallel-data segments $S_1$-$S_{11}$ in any order into any of the storage sections $RS_1$ to $RS_I$ of the reorder memory 480 as discussed above. As another example, at step 608, the process 600 can read intermediate $P_{out}$-parallel-data segments $S_1$-$S_{11}$ from outputs 414 of the memory cell array 410 illustrated in FIG. 16 and write those intermediate $P_{out}$-parallel-data segments $S_1$-$S_{11}$ in any order into any of the storage sections $RS_1$ to $RS_I$ of the reorder memory 480 as discussed above.

At step 610, the process 600 can return to repeat steps 602-608 if the reorder memory 480 is not ready. Otherwise, the process 600 can proceed to step 612, where the process 600 can read the intermediate $P_{out}$-parallel-data segments S in order from the reorder memory 480, which can be performed generally the same as or similar to step 310 in FIG. 3. The reorder memory 480 can be deemed "ready," for example, if the reorder memory 480 is filled with intermediate $P_{out}$-parallel -data segments S corresponding to all of the data block BLK.

FIG. 17 illustrates an example application of the conversion/reorder circuit 102 of FIG. 1 or any configuration or variation of the conversion/reorder circuit 102 illustrated and/or discussed herein. The pre-decoder circuit 1700 shown in FIG. 17 can comprise multiple versions of the conversion/reorder circuit 102 of FIG. 1 for performing a parallel-to-parallel conversion and a first reordering (e.g., deinterleaving) on the information portion $BLK_{info}$ and parity portion $BLK_{par}$ of a data block $BLK_{EC}$ of an encoded message MSG and a second reordering (e.g., a q -reorder) of the parity portion $BLK_{par}$. As shown, the pre-decoder circuit 1700 can comprise a symbol demapper 1701, a channel selector 1703, and a multistage permutation circuit 1704.

The symbol demapper 1701 can be configured to demap m-ary symbols of an encoded message MSG into estimated values $EV_1$ to $EV_M$ of each of the binary bits of the symbol. As is known, an m-ary symbol represents B binary bits. Examples of m-ary symbols include quadrature amplitude modulated (QAM) symbols and quadrature phase-shift keying (QPSK) modulated symbols. M-ary symbols can represent, for example, 2, 3, 4, 5, 6, or more binary bits. B can thus be 2, 3, 4, 5, 6, or more.

The symbol demapper 1701 can comprise one or more inputs for receiving a message MSG (e.g., from a distant radio frequency (RF) transmitter (not shown)) comprising a sequence of m-ary symbols. Although one input is shown in FIG. 17 for receiving the m-ary symbols of the MSG, there can instead be multiple inputs for receiving the m-ary symbols in parallel streams. The symbol demapper 1701 can also comprise an output 1702 for each of the B bits represented by a symbol. For each symbol received as part of the MSG, the symbol demapper 1701 can output an estimated value $EV_1$ of the first bit of the symbol on the first output 1702, an estimated value $EV_2$ of the second bit of the symbol on the second output 1702, an estimated value $EV_3$ of the third bit of the symbol on the third output 1702, and so on outputting an estimated value $EV_B$ of the $B^{th}$ bit of the symbol on the $B^{th}$ output 1702. Each estimated value $EV_1$ to $EV_B$ can be, for example, a log likelihood ratio (LLR) estimate of the state of the corresponding binary bit of the demapped symbol.

The message MSG received at the symbol demapper 1701 can be an encoded message encoded with a block error correction code that allows a decoder (e.g., 1714 in FIG. 17) to detect and correct errors in the message MSG. In a block error correction code, the message MSG can comprise encoded data blocks each of which comprises n binary bits k of which are information bits and n–k of which are parity bits. The symbols of the message MSG comprise the information bits and parity bits of the encoded data blocks. The estimated values $EV_1$ to $EV_B$ output 1702 by the demapper 1701 can thus be estimated values of information bits and parity bits of the encoded blocks of the message MSG. Examples of such error correction codes include FEC codes such as block- or quasi-circulant, irregular repeat-accumulate low-density parity check (QC-IRA-LDPC) codes.

The multi-stage permutation circuit 1704 can comprise a plurality of information input modules 1710, 1720, 1730 (three are shown but there can be fewer or more); at least one parity input module 1740; an information permutation circuit 1706; a parity permutation circuit 1708; an information output module 1770; a parity output module 1780; and a combiner 1712. The selector 1703 can selectively (e.g., in accordance with a control signal at its control input 1705) connect outputs 1702 of the demapper 1701 carrying estimated values EVs of information bits to the information input modules 1710, 1720, 1730. The selector 1703 can likewise selectively connect outputs 1702 carrying estimated values EVs of parity bits to the parity input module 1740. The selector 1703 can be a multiplexer or the like.

Each output 1702 of the demapper 1701 can be sufficiently wide for $P_{in}$ number of estimated values EVs in parallel. The demapper 1701 can thus output 1702 the estimated values EVs of symbols of the message MSG in streams of $P_{in}$-parallel-data segments, some comprising estimated values EVs of information bits and some comprising estimated values EVs of parity bits. The selector 1703 can set and change as needed the connection of demapper outputs 1702 to input modules 1710, 1720, 1730, 1740 so that information input streams are provided to the information input modules 1710, 1720, 1730 and at least one parity input stream is provided to the at least one parity input module 1740.

In FIG. 17, information input modules 1710, 1720, 1730 are shown receiving information input streams 1742, 1752, 1762 comprising information $P_{in}$-parallel-data segments 1744, 1754, 1764, and the parity input module 1740 is shown receiving a parity input stream 1772 comprising parity $P_{in}$-parallel-data segments 1774. The information $P_{in}$-parallel-data segments 1744, 1754, 1764 can be the information portion $BLK_{info}$ and the parity $P_{in}$-parallel-data segments 1774 can be the parity portion $BLK_{info}$ of the encoded blocks $BLK_{EC}$ of the received message MSG.

The information permutation circuit 1706 can be configured the same as or similar to the conversion/reorder circuit 200 of FIG. 2, and the parity permutation circuit 1708 can be configured the same as or similar to the conversion/reorder circuit 400 of FIG. 4. (The memory cell array 410 can be configured as a two-dimensional array as shown in FIG. 4 or a three -dimensional array as shown in FIG. 5.) Similarly, the information input modules 1710, 1720, 1730 with clock ports 1716 can be the same as or similar to the input modules 202, 206, 208 with clock ports 208 of FIG. 2, and the parity input module 1740 with location port 1726 and clock port 1728 can be the same as or similar to the input module 402 with location port 406 and clock port 408 of FIG. 4. The information input modules 1710, 1720, 1730 can thus clock the information portion $BLK_{info}$ of an encoded data block $BLK_{EC}$ into the information permutation circuit 1706 on successive cycles of a clock $CLK'_{in}$ in information $P_{in}$-parallel-data segments 1744, 1754, 1764 from information input streams 1742, 1752, 1762. The parity input module 1740 can similarly clock the parity portion $BLK_{par}$ of the encoded block $BLK_{EC}$ into the parity permutation circuit 1708 on successive cycles of a clock $CLK''_{in}$ in parity $P_{in}$-parallel-data segments 1774 from a parity input stream 1772. The clock signals $CLK'_{in}$ and $CLK''_{in}$ can be versions of the $CLK_{in}$ signals illustrated in FIGS. 2 and 4. In FIG. 17, the clock signals $CLK'_{in}$ and $CLK''_{in}$ can be the same clock signal or different clock signals.

The information permutation circuit 1706 can then perform a $P_{in}$-to-$P_{out}$ parallel conversion and a $P_{out}$-segment reorder on the information estimated values EVs. The $P_{out}$-segment reorder can be, for example, a de-interleaving of the information estimated values EVs of the encoded data block $BLK_{EC}$. The output module 1770 (which, with its clock port 1776 and enable port 1778 can be the same as or similar to the output module 270 and its clock port 276 and enable port 278 of FIG. 2) can clock on cycles of a clock $CLK'_{out}$ the reordered information estimated values EVs from the information permutation circuit 1706 as a stream 1782 of $P_{out}$-parallel-data segments 1784, which can constitute a permuted version $\pi BLK_{info}$ of the information portion $BLK_{info}$ of the encoded block $BLK_{EC}$.

Similarly, the parity permutation circuit 1708 can perform the same $P_{in}$-to-$P_{out}$ parallel conversion and $P_{out}$-segment reorder as well as a q-reorder on the estimated values EVs of the parity $P_{in}$-parallel-data segments 1774 that constitute the parity portion $BLK_{par}$ of the encoded block $BLK_{EC}$. The output module 1780 (which, with its clock port 1786 and enable port 1788 can be the same as or similar to the output module 470 and its clock port 476 and enable port 478 in FIG. 4) can clock on cycles of a clock $CLK''_{out}$ the parity estimated values EVs from the parity permutation circuit 1708 as a stream 1792 of parity $P_{out}$-parallel-data segments 1794, which can constitute a permuted version $\pi BLK_{par}$ of the parity portion $BLK_{par}$ of the encoded block $BLK_{EC}$. The clock signals $CLK'_{out}$ and $CLK''_{out}$ can be versions of the $CLK_{out}$ signals illustrated in FIGS. 2 and 4. In FIG. 17, the clock signals $CLK'_{out}$ and $CLK''_{out}$ can be the same clock signal or different clock signals.

The combiner 1712 can then combine the permuted information portion $\pi BLK_{info}$ with the corresponding permuted parity portion $\pi BLK_{par}$ to form a permuted version $\pi BLK_{EC}$ of the encoded data block $BLK_{EC}$. The multistate permutation circuit 1704 can do the same to each of the encoded data blocks $BLK_{EC}$ of the message MSG and thus provide the encoded data blocks of the message MSG to a decoder 1714 as permuted encoded data blocks $\pi BLK_{par}$ in which: (1) the information estimated values EVs of the information portion $BLK_{info}$ and the parity estimated values EVs of the parity portion $BLK_{par}$ have both been converted from a $P_{in}$ parallel format to a $P_{out}$ parallel format and reordered in accordance with a $P_{out}$-segment reordering (e.g., de-interleaving); and (2) the parity estimated values EVs have further been reordered in accordance with a q-reordering. Examples of such q-reorderings of the parity estimated values of an encoded data block $BLK_{EC}$ are disclosed in US patent application Ser. No. 14/055,734, which was filed Oct. 16, 2013 by the assignee of the present application.

The pre-encoder circuit 1700 illustrated in FIG. 17 is but an example and variations are contemplated. For example, the multistage permutation circuit 1704 can comprise more than one information permutation circuit 1706. For example, a plurality of information permutation circuits 1706 can be configured to process different portions of the information portion $BLK_{info}$ of encoded data blocks $BLK_{EC}$ in parallel. As another example, each of a plurality of information permutation circuits 1706 can be configured to perform a different $P_{in}$-to-$P_{out}$ parallel processing and/or different reorder operation on the information portion $BLK_{info}$ of encoded data blocks $BLK_{EC}$. One of the plurality of information permutation circuits 1706 can be selected to perform one type of $P_{in}$-to-$P_{out}$ parallel processing and/or reorder operation on the information portion $BLK_{info}$ of one type of encoded data blocks $BLK_{EC}$. A different one of the plurality of information permutation circuits 1706 can later be selected to perform a different type of $P_{in}$-to-$P_{out}$ parallel processing and/or reorder operation on the information portion $BLK_{info}$ of a different type of encoded data blocks $BLK_{EC}$. The multistage permutation circuit can similarly comprise a plurality of parity permutation circuits 1708.

The pre-encoder circuit 1700 can include fewer or additional elements or functionality than shown in FIG. 17 or discussed above. For example, the pre-encoder 1700 can comprise elements for buffering, as needed, the information portion $BLK_{info}$ and/or the parity portion $BLK_{par}$ of an encoded data block $BLK_{EC}$. Thus, for example, the pre-encoder 1700 can buffer the parity portion $BLK_{par}$ of an encoded data block $BLK_{EC}$ until all or at least enough of the parity portion $BLK_{par}$ has been received to process in the parity permutation circuit 1708.

FIG. 18 illustrates a process 1800 that is an example of operation of the pre-decoder 1700 of FIG. 17. As shown in FIG. 17, the controller 190 of FIG. 1 can be connected to and control part or all of the operation (and thus part or all of the process 1800) of the multi-stage permutation circuit 1704.

At step 1802, the information input modules 1710, 1720, 1730 can clock on cycles of a clock $CLK'_{in}$ information $P_{in}$-parallel-data segments 1744, 1754, 1764 from information input streams 1742, 1752, 1762 into the information permutation circuit 1706 as discussed above. Substantially simultaneously, at step 1810, the at least one parity input module 1740 can clock on cycles of the clock $CLK''_{in}$ parity $P_{in}$-parallel-data segments 1774 from at least one parity input stream 1772 into the parity permutation circuit 1708 also as discussed above.

At steps 1804 and 1806, the information permutation circuit 1706 can perform a $P_{in}$-to-$P_{out}$ parallel conversion and a $P_{out}$-segment reorder of the information estimated values EVs of the information $P_{in}$-parallel-data segments 1744, 1754, 1764 as discussed above. Similarly, at steps 1812, 1814, 1816, the parity permutation circuit 1708 can perform the same $P_{in}$-to-$P_{out}$ parallel conversion and the same $P_{out}$-segment reorder as well as a q-reorder on the parity estimated values EVs of the parity $P_{in}$-parallel-data segments 1774 also as discussed above.

At step 1808, the information output module 1770 can clock the information estimated values EVs of the $P_{in}$-parallel-data segments 1744, 1754, 1764 reordered in accordance with the $P_{out}$-segment reorder out of the information permutation circuit 1706 in information $P_{out}$-parallel-data segments 1784, which can constitute a permuted version $\pi BLK_{info}$ of the information portion $BLK_{info}$ of the encoded data block $BLK_{EC}$ as discussed above. At step 1818, the parity output module 1780 can similarly clock the parity estimated values EVs of the parity $P_{in}$-parallel-data segments 1774 reordered in accordance with the q-reorder and the $P_{out}$-segment reorder out of the parity permutation circuit 1708 in parity $P_{out}$-parallel-data segments 1794, which can constitute the permuted version $\pi BLK_{par}$ of the parity portion $BLK_{par}$ of the encoded data block $BLK_{EC}$ as discussed above.

At step 1820, the combiner 1712 can combine the permuted information portion $\pi BLK_{info}$ with the corresponding permuted parity portion $\pi BLK_{par}$ and output a permuted version $\pi BLK_{EC}$ of the encoded data block $BLK_{EC}$. The combiner 1712 can provide such permuted data blocks $\pi BLK_{EC}$ to a decoder 1714, which can decode the permuted data blocks $\pi BLK_{EC}$ into the original message MSG.

Although specific embodiments and applications of the invention have been described in this specification, these embodiments and applications are exemplary only, and many variations are possible.

We claim:

1. A process performed by a permutation apparatus that is interfaced with a decoder for decoding encoded data blocks that are input to the permutation apparatus, of efficiently permuting data elements in the encoded data blocks so that the data elements are in a format suitable for the decoder, the process comprising:
    receiving, in parallel segments of a first size, data elements of an encoded data block, the data elements being arranged in a first order, wherein the first size is incompatible with the decoder of the communications receiver;
    performing a parallel-to-parallel conversion of the data elements to produce data elements in parallel segments of a second size different from the first size, wherein the second size is compatible with the decoder;
    after performing the parallel-to-parallel conversion, reordering the data elements into a second order that is different than the first order; and
    passing the data elements in parallel segments of the second size to the decoder for decoding of the encoded data block.

2. The process of claim 1, wherein the second size is larger than the first size.

3. The process of claim 1 further comprising:
    reordering the data elements from the second order into a third order that is different than the first order and the second order.

4. The process of claim 1, wherein performing the parallel-to-parallel conversion and reordering the data elements comprises writing, in parallel segments of the first size, the data elements arranged in the first order into a memory cell array, and reading the data elements, in parallel segments of the second size and in accordance with the second order, from the memory cell array.

5. The process of claim 4, wherein reading the data elements comprises placing the parallel segments of the second size in an order in which the data elements of the data block are reordered into a third order that is different than the first order and the second order.

6. The process of claim 4, wherein:
    writing the data elements comprises clocking the parallel segments of the first size into the memory cell array on cycles of a clock, and
    reading the data elements comprises clocking the parallel segments of the second size from the memory cell array on cycles of the clock.

7. The process of claim 4, wherein
    the memory cell array comprises W rows and Pout columns of memory devices, where W is an integer greater than one and Pout is equal to the second size,
    each memory device comprises A individually addressable memory cells, where A is an integer greater than one,
    each memory cell is configured to store one of the data elements,
    writing the data elements comprises filling q and only q of the memory cells in each of the columns of memory devices in order from column one to column Pout, and
    q is greater than one and less than or equal to W*A.

8. The process of claim 7, wherein:
    reading comprises reading q of the parallel segments of the second size from the filled memory cells, and
    each of the q parallel segments of the second size comprises data elements from a same location of the memory devices in a same one of the rows.

9. The process of claim 7, wherein filling comprises filling the memory cells in each column in order from a first of the memory cells in the column to a qth of the memory cells in the column.

10. The process of claim 9, wherein:
    W is equal to the first size,
    the first of the memory cells is the memory cell at location one in the memory device in row one of the column, and
    the qth of the memory cells is the memory cell at location $\rceil q/W\lceil$ in the memory device in row $\mod((q-1)/W)+1$ of the column.

11. The process of claim 10, wherein:
    reading comprises, after filling, reading, as q of the parallel segments of the second size, the data elements from the filled memory cells,
    each one of the q parallel segments of the second size comprises all of the data elements from a same location in each of the memory devices in one of the rows.

12. The process of claim 9, wherein an order of the memory cells in each of the columns is as follows: the memory cells at a same location in each of the memory devices from the first row to a last of the rows of the column, repeating the foregoing for each location in the memory devices from location one to a last location A.

13. The process of claim 7, wherein writing further comprises writing each data element of one of the parallel segments of the first size into a different one of the memory devices.

14. The process of claim 13, wherein reading comprises reading each data element of one of the parallel segments of the second size from a different one of the memory devices.

15. The process of claim 1, wherein:
    receiving comprises receiving the data elements of the data block in M streams of parallel segments of the first size, where M is an integer greater than one;
    performing the parallel-to-parallel conversion comprises:
        writing the parallel segments of the first size from each of the M streams into a different one of M memory cell arrays each comprising Pin rows and Pout/Pin columns of memory cells, each memory cell configured to store one of the data elements, wherein Pin is equal to the first size and Pout is equal to the second size; and
        after a section of each of the M memory cell arrays fills with Pout of the data elements, reading the Pout data elements from the filled section as one of the parallel segments of the second size.

16. The process of claim 15, wherein reordering comprises placing the parallel segments of the second size read from the memory cell arrays in an order in which the data elements of the data block are in the second order.

17. The process of claim 15, wherein Pout/Pin is not an integer.

18. The process of claim 7, wherein each memory device includes a single port for clocking a data element into the memory device and a single port for clocking a data element from the memory device.

19. The process of claim 18, wherein the single port for clocking a data element into the memory device and the single port for clocking a data element from the memory device are the same port.

20. A process performed by a permutation apparatus that is interfaced with a decoder for decoding encoded data blocks that are input to the permutation apparatus, of efficiently permuting data elements in the encoded data blocks so that the data elements are in a format suitable for the decoder, the process comprising:

receiving, at the permutation apparatus, an encoded data block that comprises a sub-block of information data elements and a sub-block of parity data elements, the information data elements and the parity data elements being received in parallel segments of a first size that is incompatible with the decoder;

producing a permuted version of the sub-block of information data elements by performing, in an information permutation circuit, a parallel-to-parallel conversion and a first reordering of the information data elements, the parallel-to-parallel conversion of the information data elements producing information data elements in parallel segments of a second size different from the first size, wherein the second size is compatible with the decoder;

producing a permuted version of the sub-block of parity data elements by performing, in a parity permutation circuit, the parallel-to-parallel conversion and a second reordering of the parity data elements, the parallel-to-parallel conversion of the parity data elements producing parity data elements in parallel segments of the second size, wherein the second reordering is different than the first reordering; and passing the permuted versions to the decoder for decoding of the encoded data block.

21. The process of claim 20, wherein the second reordering comprising an initial reordering of the parity data elements that places the parity data elements into an intermediate order followed by performing the first reordering on the parity data elements placing the parity data elements in a second order.

22. The process of claim 20, wherein:

the first reordering comprises performing a de-interleaving on the information data elements; and the second reordering comprises:

performing a q-reorder on the parity data elements in which an order of the parity data elements is changed from a first order having an order index i from 0 to $(q*p)-1$ to a q-order having an order index $i'=p*\mod(i/q)+[i/q]$, where q is a reorder parameter, $q*p$ is the total number of parity data elements, and $[i/q]$ is a floor function of $i/q$; and then performing the de-interleaving on the parity data elements in the q-order.

23. The process of claim 20, wherein producing the permuted version of the sub-block of parity data elements comprises:

writing the parity data elements arranged in a first order in parallel segments of a first size into a memory cell array;

reading the parity data elements arranged in an intermediate order in parallel segments of a second size from the memory cell array; and reordering the parallel segments of the second size of the parity data elements such that the parity data elements are arranged in a second order, wherein:

the first size and the second size are unequal integers, each of the first order, the intermediate order, and the second order is a different order of the parity data elements in the sub-block of parity data elements.

24. The process of claim 23, wherein producing the permuted version of the sub-block of information data elements comprises:

writing the information data elements arranged in an initial order in parallel segments of the first size into a plurality of memory cell arrays;

reading the information data elements arranged in the initial order in parallel segments of the second size from the plurality of memory cell arrays; and reordering the parallel segments of the second size of the information data elements such that the information data elements are arranged in a secondary order, wherein the initial order and the secondary order are different orders of the information data elements in the sub-block of information data elements.

* * * * *